US007821823B2

(12) United States Patent
Sunamura et al.

(10) Patent No.: US 7,821,823 B2
(45) Date of Patent: Oct. 26, 2010

(54) SEMICONDUCTOR MEMORY DEVICE, METHOD OF DRIVING THE SAME AND METHOD OF MANUFACTURING THE SAME

(75) Inventors: Hiroshi Sunamura, Tokyo (JP); Kouji Masuzaki, Tokyo (JP); Masayuki Terai, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 333 days.

(21) Appl. No.: 12/095,866

(22) PCT Filed: Dec. 1, 2006

(86) PCT No.: PCT/JP2006/324506

§ 371 (c)(1),
(2), (4) Date: Jun. 2, 2008

(87) PCT Pub. No.: WO2007/064048

PCT Pub. Date: Jun. 7, 2007

(65) Prior Publication Data
US 2009/0316484 A1 Dec. 24, 2009

(30) Foreign Application Priority Data
Dec. 2, 2005 (JP) .............................. 2005-348677

(51) Int. Cl.
*G11C 16/04* (2006.01)
(52) U.S. Cl. .............................. 365/185.01; 365/185.18; 365/185.15; 257/324; 438/287

(58) Field of Classification Search ............ 365/185.01, 365/185.18, 185.15; 257/324; 438/287
See application file for complete search history.

(56) References Cited

U.S. PATENT DOCUMENTS

| 6,191,975 B1 * | 2/2001 | Shimizu et al. | ........ 365/185.01 |
| 6,674,109 B1 * | 1/2004 | Fujimori et al. | ............. 257/295 |
| 7,411,242 B2 * | 8/2008 | Kobayashi et al. | ..... 365/185.01 |

FOREIGN PATENT DOCUMENTS

| JP | 54-163679 | 12/1979 |
| JP | 2001-156189 | 6/2001 |
| JP | 2002-9179 | 1/2002 |
| JP | 2002-203917 | 7/2002 |
| JP | 2002-217317 | 8/2002 |
| JP | 2002-261175 | 9/2002 |
| JP | 2003-282567 | 10/2003 |
| JP | 2004-235519 | 8/2004 |
| JP | 2005-228760 | 8/2005 |

* cited by examiner

*Primary Examiner*—Huan Hoang
(74) *Attorney, Agent, or Firm*—Young & Thompson

(57) ABSTRACT

Disclosed is a semiconductor storage device comprising a semiconductor substrate, a first and a second impurity diffusion layer formed in the semiconductor substrate, a gate insulating film formed on the semiconductor substrate, and a first gate electrode formed on the semiconductor substrate via the gate insulating film. The gate insulating film has a nitrogen-containing silicon oxide film inside, and a silicon oxide film is so arranged on both sides of the nitrogen-containing silicon oxide film as to sandwich the nitrogen-containing silicon oxide film. In addition, the nitrogen composition in the nitrogen-containing silicon oxide film is increased from the semiconductor substrate side to the first gate electrode side.

60 Claims, 14 Drawing Sheets (a)

(b)

(a)

(b)

SEMICONDUCTOR MEMORY DEVICE, METHOD OF DRIVING THE SAME AND METHOD OF MANUFACTURING THE SAME

TECHNICAL FIELD

The present invention relates to a semiconductor memory device, a method of driving the same and a method of manufacturing the same, and particularly, the present invention relates to a semiconductor memory device having a plurality of semiconductor memory cells that can hold information by capturing electrical charges at a trap level in a gate insulation film, a method of driving the same and a method of manufacturing the same.

BACKGROUND ART

In recent years, a demand of a nonvolatile memory is increased as a rewritable semiconductor memory device. In a flash memory that is a typical example of the nonvolatile memory, one using a floating gate is the mainstream, but it is considered that it is difficult to make a tunnel gate oxide film be miniaturized, and it is also considered that the miniaturization is approaching miniaturization limit thereof.

As a technique to overcome this miniaturization limit, a trap type semiconductor memory device has received high attention recently. In the trap type semiconductor memory device, an insulation film having a trap level is formed on a tunnel gate oxide film formed on a semiconductor substrate. Information is stored by capturing an electrical charge at the trap level that exists in this insulation film.

As a representative example of the trap type semiconductor memory device in which the trap level in the insulation film is a storage node, an MNOS (Metal-Nitride-Oxide-Semiconductor) memory and an MONOS (Metal-Oxide-Nitride-Oxide-Semiconductor) memory are mentioned. In the MNOS memory and the MONOS memory, a silicon nitride film (N) is used as an insulation film having a trap level.

A structure and a programming method of the MONOS type semiconductor memory device are disclosed in Japanese Patent Application Publication No. 2001-156189 (Patent Document 1), for example. The structure and an operation method of the semiconductor memory device disclosed in Patent Document 1 will be explained briefly using FIG. 18.

An MONOS type semiconductor memory cell 50 disclosed in Patent Document 1 is constructed as follows. As shown in FIG. 18, n type first and second impurity diffused layers 52, 53 that are to respectively become source and drain regions of the semiconductor memory cell 50 are formed in a p type silicon substrate 51. A silicon dioxide film 54 is formed on the silicon substrate 51, and a silicon nitride film 55 that is an electrical charge accumulation layer is formed on the silicon dioxide film 54. A silicon dioxide film 56 is formed on the silicon nitride film 55, and a gate electrode 57 made of polysilicon is formed thereon. A boron implant 58 is then formed at a channel region side of each of the first and second impurity diffused layers 52, 53. The silicon dioxide film 54—the silicon nitride film 55—the silicon dioxide film 56 forms an insulation structure of the MONOS type semiconductor memory cell, which is called as ONO. The semiconductor memory cell 50 getting the above structure has a MIS type transistor structure in which the ONO as an insulation structure (I) is put between the silicon substrate 51 that is a semiconductor and the gate electrode 57.

A writing operation using channel hot electrons (Channel Hot Electron; CHE) of the MONOS type memory cell shown in FIG. 18 will be described. In the CHE, writing is carried out by applying voltage of specific voltage or more between the first and second impurity diffused layers 52, 53 that are source and drain regions, and further applying voltage of specific voltage or more to the gate electrode 57. According to the CHE, hot electrons are locally generated in the vicinity of the second impurity diffused layer 53 that is the drain region. However, electrons that can get over an energy barrier of the silicon dioxide film 54 reach the silicon nitride film 55, and are captured at discrete trap levels in the silicon nitride film 55. In this element structure, by changing voltage to be applied to a pair of source and drain regions (52, 53), it is possible to selectively realize local writing to the trap levels near the first impurity diffused layer 52 and the trap levels near the second impurity diffused layer 53 in the silicon nitride film 55. A 2-bit storing operation can be carried out in a one-transistor type semiconductor memory cell 50 in this way. On the other hand, an erasing operation is carried out by implanting hot holes generated in the vicinity of the first impurity diffused layer 52 or the second impurity diffused layer 53 due to interband tunneling to the silicon nitride film 55 to neutralize the accumulated electrons. The hot holes are generated by applying voltage of specific voltage or more between the source and drain regions (52, 53), and further applying negative voltage whose absolute value is specific voltage or more to the gate electrode 57.

In the memory cell disclosed in Patent Document 1, by providing boron implants 58 at junctional portions of the source and drain regions, a region in which electric field intensity is heightened is formed near the drain region of a channel region at writing/erasing, whereby a difference between an implantation region of the hot electrons and an implantation region of the hot holes in the silicon nitride film 55 is to be reduced. Thus, even though the programming cycle number is increased, it avoids increasing the amount of remaining electrons in the silicon nitride film 55 after erasing.

In this regard, the writing and erasing method disclosed in Patent Document 1 is one using hot electrons and hot holes, but other than the method, for example, there is a method of applying voltage of specific voltage or more between the silicon substrate 51 and the gate electrode 57, implanting electrons or holes by means of Fowler-Nordheim (FN) tunnel at writing and drawing electrons or holes by means of the FN tunnel at erasing. However, 2-bit writing that takes advantage of locality of the trap levels in the silicon nitride film 55 cannot be carried out by means of FN tunnel writing.

DISCLOSURE OF THE INVENTION

Problems to be Solved by the Invention

It is revealed that there are some critical problems in the conventional MONOS type semiconductor memory device described above on the basis of study and development of a semiconductor memory device by inventors of the present invention.

A first problem is that erasing time is too long. In the case of an MONOS structure using a silicon nitride film, erasing time is about 0.1 seconds. Although improvement has been attempted by changing a film thickness of each of an oxide film and a silicon nitride film in an MONOS structure, this erasing time could not have been improved drastically. In this regard, this erasing time was substantially a similar numerical value even though some literatures were examined.

Speeding up of the erasing speed is a critical issue of speeding up of an operation of a semiconductor memory device. Considering that a nonvolatile semiconductor memory device is incorporated into a wide variety of integrated circuits and performance improvement is strongly desired, necessity for high-speed erasing is growing. Since there is a report that writing time is about 100 μsec ($10^{-4}$ seconds) or shorter, it is required to improve relatively late erasing time.

Moreover, in an MONOS type semiconductor memory device that carries out an operation to neutralize electrons using hot holes as described above, lengthening of erasing time means that hot holes keep flowing to a silicon dioxide film that is a tunnel oxide film for a long time by just that much. It is said that a hot hole causes deterioration in reliability of the silicon dioxide film, and in the MONOS type semiconductor memory device, deterioration in reliability of a tunnel oxide film is also undesirable. It is considered that deterioration in reliability of the tunnel oxide film affects resistance to repetition of writing and erasing and a retention characteristic of a semiconductor memory device, it is important to improve erasing time at erasing using hot holes.

A second problem is that variation in threshold voltage after erasing is large in the conventional MONOS type semiconductor memory device. In the case where variation in threshold voltage after erasing is large, harmful effects that a lot of electrical charges more than necessary are to be implanted when programming, and reading voltage is to be heightened, for example, are caused.

A third problem is that in the conventional MONOS type semiconductor memory device carriers implanted by being exposed in a high temperature atmosphere after programming or repeating reading operations move in the silicon nitride film. Movement of the carriers causes variation in the threshold voltage, and this leads to errors, whereby deterioration in reliability is caused.

The subjects of the present invention is to solve the problems of the prior art described above, and it is an object of the present invention first to enable erasing speed to be heightened, second to reduce variation in threshold voltage after erasing, and third to enable movement of carriers after programming to be controlled.

Means for Solving the Problems

In order to achieve the above objects, according to the present invention, there is provided a semiconductor memory device including a plurality of memory cells each carrying out a storing operation by capturing an electrical charge in a gate insulation film, the memory cell having: a semiconductor substrate; first and second impurity diffused layers formed in the semiconductor substrate; a gate insulation film formed on the semiconductor substrate; and a first gate electrode formed on the semiconductor substrate through the gate insulation film, the gate insulation film having a nitrogen-containing silicon dioxide film therein, the periphery of the nitrogen-containing silicon dioxide film being enclosed by an insulation film having a band gap higher than that of the nitrogen-containing silicon dioxide film, nitrogen composition in the nitrogen-containing silicon dioxide film becoming higher at a side of the first gate electrode compared with a side of the semiconductor substrate.

Further, in order to achieve the above objects, according to the present invention, there is provided a semiconductor memory device including a plurality of memory cells each carrying out a storing operation by capturing an electrical charge in a gate insulation film, the memory cell having: a semiconductor substrate; first and second impurity diffused layers formed in the semiconductor substrate; a gate insulation film formed on the semiconductor substrate; and a first gate electrode formed on the semiconductor substrate through the gate insulation film, the gate insulation film being constructed from at least three layers of insulation films, three layers of the gate insulation film at a side of the semiconductor substrate being a silicon dioxide film, a nitrogen-containing silicon dioxide film and an insulation film having a larger band gap than that of the nitrogen-containing silicon dioxide film, nitrogen composition in the nitrogen-containing silicon dioxide film increasing from a side of the semiconductor substrate toward a side of the first gate electrode.

Moreover, in order to achieve the above objects, according to the present invention, there is provided a semiconductor memory device including a plurality of memory cells each carrying out a storing operation by capturing an electrical charge in a gate insulation film, the memory cell having: a semiconductor substrate; first and second impurity diffused layers formed in the semiconductor substrate; a gate insulation film formed on the semiconductor substrate; and a first gate electrode formed on the semiconductor substrate through the gate insulation film, the gate insulation film being constructed from a silicon dioxide film, a nitrogen-containing silicon dioxide film and a silicon dioxide film from a side of the semiconductor substrate, nitrogen composition in the nitrogen-containing silicon dioxide film increasing from a side of the semiconductor substrate toward a side of the first gate electrode.

Furthermore, in order to achieve the above objects, according to the present invention, there is provided a semiconductor memory device including a plurality of memory cells each carrying out a storing operation by capturing an electrical charge in a gate insulation film, the memory cell having: a semiconductor substrate; first and second impurity diffused layers formed in the semiconductor substrate; a gate insulation film formed on the semiconductor substrate; and a first gate electrode formed on the semiconductor substrate through the gate insulation film, the gate insulation film having a nitrogen-containing silicon dioxide film therein, the periphery of the nitrogen-containing silicon dioxide film being enclosed by an insulation film having a band gap higher than that of the nitrogen-containing silicon dioxide film, nitrogen composition in the nitrogen-containing silicon dioxide film continuously changing in a direction perpendicular to the semiconductor substrate, a portion in which the nitrogen composition becomes maximal existing at a specific portion in which a distance from the first gate electrode being less than half of a film thickness of the nitrogen-containing silicon dioxide film.

Effect of Invention

In the semiconductor memory cell having the above structure, electrical charges implanted by programming are intensively accumulated at a portion near the first gate electrode of the nitrogen-containing silicon dioxide film. Further, electrical charges implanted at erasing are also concentrated on a portion near the first gate electrode of the nitrogen-containing silicon dioxide film. In addition, since electrical charges that are to store information exist in the portion, it is possible to carry out erasing in a short time. Further, by implanting electrical charges for intensive erasing into the region in which the electrical charges implanted by programming are concentrated, neutralization of the electrical charges tends to occur, whereby variation in the threshold voltage after erasing can be kept low. Moreover, since subsequent movement of the electrical charges implanted by programming can be controlled in the nitrogen-containing silicon dioxide film, variation in threshold voltage in an information retention period can be kept low.

BEST MODE FOR CARRYING OUT THE INVENTION

First Embodiment

Hereinafter, preferred embodiments of the present invention will be described with reference to the appending drawings. In this regard, nitrogen composition in a nitrogen-containing silicon dioxide film in the present specification means the number of nitrogen atoms/(the number of nitrogen atoms+the number of oxygen atoms). Namely, in the case of a pure silicon dioxide film, nitrogen composition becomes 0%. In the case of a pure silicon nitride film, nitrogen composition becomes 100%.

The inventors of the present invention have studied a nonvolatile semiconductor memory device in order to solve the above problems. Prior to description of the present embodiment, matters that the inventors of the present invention studied in advance will be described. In this regard, it is considered that the electrical charges accumulated in an MONOS type semiconductor memory device as described above are electrons and holes, but the explanation will here be described on the assumption that electrons are the accumulated electrical charges. In the case where holes are used as the accumulated electrical charges, it is also apparent that similar effects can be obtained by the structure disclosed by the present invention.

It is considered that the long erasing time described above is caused by the fact that electrons are discretely accumulated in the entire silicon nitride film that is an electrical charge accumulation layer. It will be described later in detail using the drawings. In the case where erasing is carried out by implantation of hot holes when electrons are discretely accumulated in the entire film that if the electrical charge accumulation layer, the hot holes are to move about the inside of the electrical charge accumulation layer until the holes implanted in the electrical charge accumulation layer recombine with all of the accumulated electrons to complete neutralization. In the case where the electrical charge accumulation layer has a conductive property like polysilicon, it can be expected that holes are easily conducted and erasing is thereby carried out for a short time. However, in the case where the electrical charge accumulation layer is an insulator like the MONOS type semiconductor memory device, it takes a long time for erasing because conduction of holes hardly occurs. Further, variation in a threshold value after erasing occurs because electrons cannot be neutralized.

Figure 1:
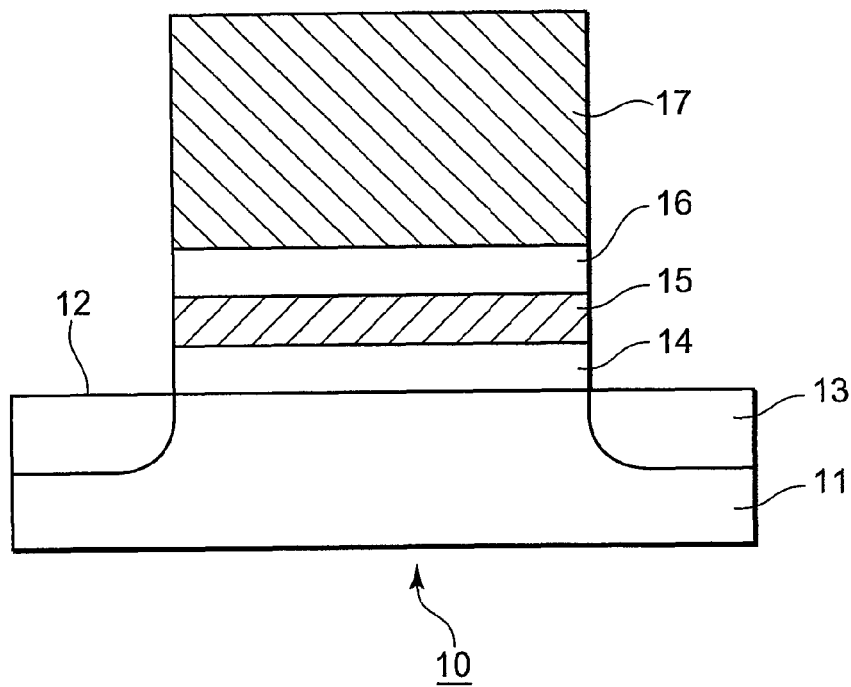
FIG. 1 is a sectional view showing a structure of a semiconductor memory cell according to a first embodiment of the present invention.

Then, the inventors of the present invention come to devise a structure of a memory cell as follows. The structure will be described with reference to FIG. 1.

A semiconductor memory cell 10 according to a first embodiment of the present invention has a semiconductor substrate 11, a first impurity diffused layer 12 and a second impurity diffused layer 13 formed in the semiconductor substrate 11, a silicon dioxide film 14 formed on the semiconductor substrate 11, a nitrogen-containing silicon dioxide film 15, a gate insulation film (first gate insulation film) composed of a silicon dioxide film 16, and a first gate electrode 17 formed on the semiconductor substrate 11 through the gate insulation film. Nitrogen composition in the nitrogen-containing silicon dioxide film 15 increases from a side of the semiconductor substrate 11 toward the first gate electrode 15. In this regard, the films 14 and 16 constituting the gate insulation film is not limited to the silicon dioxide film, and an insulating material to become a potential barrier, by which the electrical charges accumulated in the nitrogen-containing silicon dioxide film 15 cannot break away, can be used. The important point is that the nitrogen-containing silicon dioxide film 15 is included in the gate insulation film, and a material of the gate insulation films sandwiching the nitrogen-containing silicon dioxide film 15 therebetween can be a silicon dioxide film, an insulation film with a high dielectric constant or a combination thereof. Further, the silicon dioxide film 16 near the first gate electrode 17 can also be a film of an ONO structure.

Figure 2:
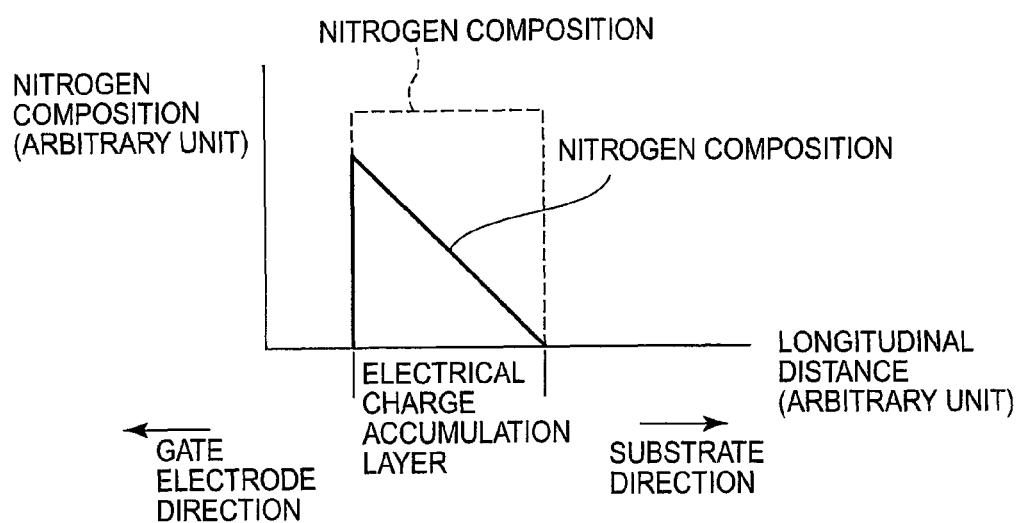
FIG. 2 is a view schematically showing a nitrogen composition profile in a nitrogen-containing silicon dioxide film of the semiconductor memory cell according to the first embodiment of the present invention.

An example of the nitrogen composition in the nitrogen-containing silicon dioxide film 15 is shown in FIG. 2. Nitrogen composition (broken line) of the silicon nitride film that is the electrical charge accumulation layer in the conventional example is fixed as shown in FIG. 2, while in the nitrogen-containing silicon dioxide film that is the electrical charge accumulation layer of the present invention, nitrogen composition (solid line) monotonously increases from 0 from the semiconductor substrate 11 toward the first gate electrode.

New effects obtained in the structure of the semiconductor memory cell according to the present invention will be described below. FIG. 3(a) shows a band diagram of the semiconductor memory cell at no application of voltage, that is, at storing and retaining, and FIG. 3(b) shows a band diagram of the memory cell at an erasing operation.

The semiconductor memory device in the integrated circuit is exposed to various thermal ambiences depending on its use. In the case of harsh one, an environment at 150 to 200° C. is assumed. In a semiconductor memory device using a trap level in an insulation film such as an MONOS type semiconductor memory device, a process in which electrons are excited to a conduction band of the insulation film from the trap level due to external temperature once and falls to the trap level again may occur. Namely, the implanted electrons are redistributed in the insulation film depending on the thermal ambience. A method of redistributing them depends on a band diagram of the electrical charge accumulation layer. Electrons have a property to fall to deeper level. For this reason, in the case of the band diagram as shown in FIG. 3(a), distribution of electrons is concentrated on a position of low energy, that is, a portion of high nitrogen composition. In fact, it was found that in the region of high nitrogen composition, trap density increases in addition to the effect that the conduction band is lowered. These means that electrons are intensively distributed already at writing and in the semiconductor memory cell structure of the present invention, electrical charges are accumulated in a region of higher nitrogen composition from the early stage. As can be seen from the above, distribution of the accumulated electrical charges becomes high at a region near the gate electrode in the nitrogen-containing silicon dioxide film [FIG. 3(c)]. Then, in this distribution state, a substantially original state is kept even when it is exposed to various environmental changes at storage retention. On the other hand, with reference to the band diagram at erasing in FIG. 3(b), the hot holes generated in the vicinity of the drain of the silicon substrate are attracted to the gate electrode to which negative voltage is applied, and a part thereof gets over a barrier of the silicon dioxide film and is implanted to a valence band of the electrical charge accumulation layer. As shown in FIG. 3(b), since an electric field is also applied to the electrical charge accumulation layer during an erasing operation, the implanted holes moves in a gate electrode direction. Namely, as shown in FIG. 3(c), distribution of the implanted holes in a perpendicular direction is extremely close to distribution of the accumulated electrical charges in a perpendicular direction, and the electrons collide with the holes to be neutralized. Further, in the case where a profile of the nitrogen composition is conversely high at a side of the semiconductor substrate, the electrons implanted at the side of the gate electrode once are redistributed to the side of the semiconductor substrate at data retention. The redistribution of the electrical charges after writing causes variation in threshold voltage, and it is thus undesirable in view of data reliability. For this reason, the profile of the nitrogen composition disclosed by the present invention is preferable.

Here, an erasing operation in the semiconductor memory cell of the conventional example will be described using FIG. 4. In the case of the semiconductor memory cell having a band diagram as shown in FIG. 4(a) according to the conventional example, accumulated electrons are distributed over the entire electrical charge accumulation layer as shown in FIG. 4(c). On the other hand, since a band diagram at an erasing operation becomes as shown in FIG. 4(b), distribution of the implanted holes becomes as shown in FIG. 4(c). The holes moving in the gate electrode direction cannot easily neutralize the electrons that are widely distributed in the silicon nitride film, and it thus takes long erasing time. Further, electrons left unneutralized tend to remain, and this tends to cause variation in the threshold voltage.

Figure 3:
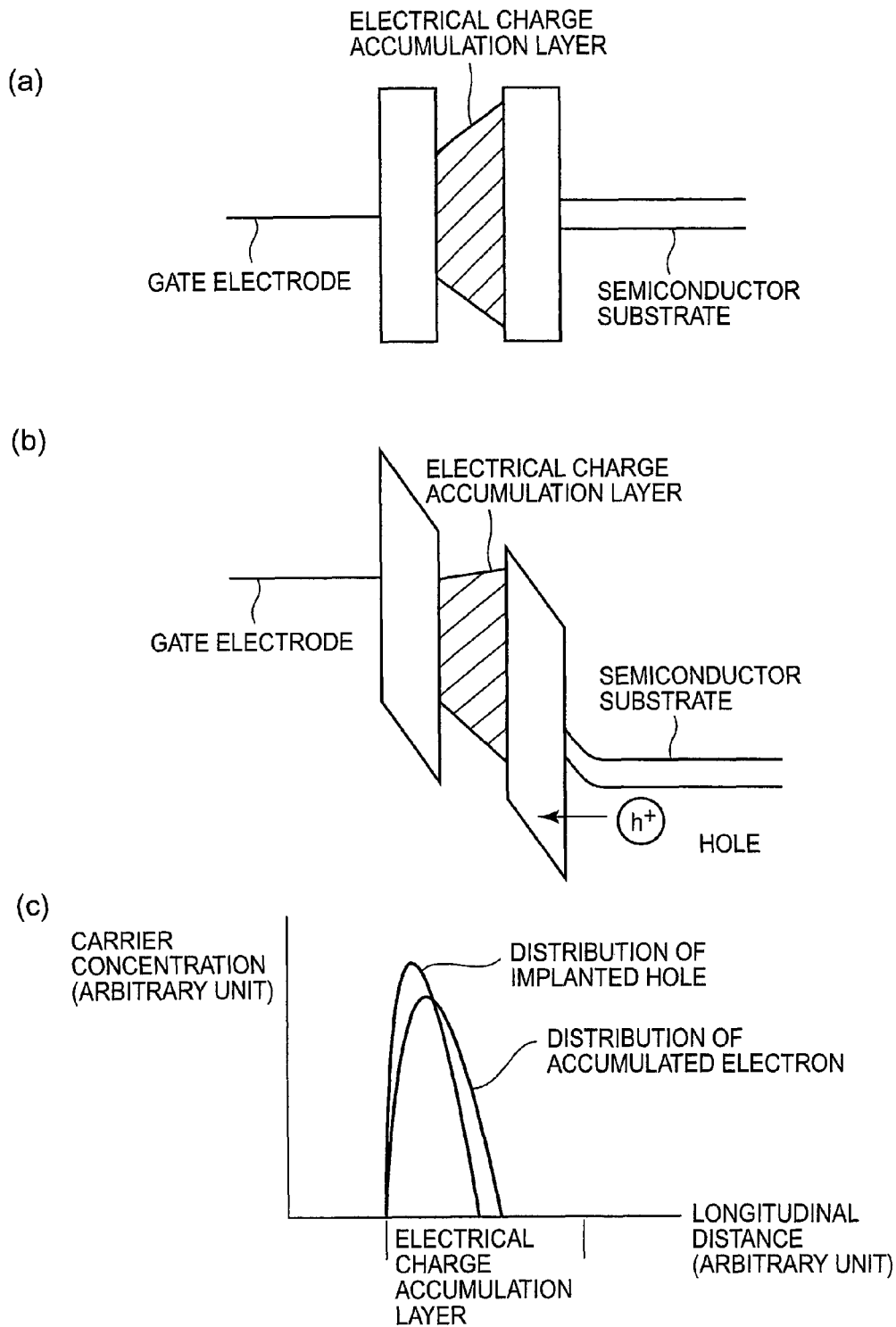
FIG. 3(a) is a view showing a band diagram at no application of voltage to the semiconductor memory cell according to the first embodiment of the present invention.
FIG. 3(b) is a view showing a band diagram at erasing of the semiconductor memory cell according to the first embodiment of the present invention.
FIG. 3(c) is a view showing a distribution of accumulated electrons and holes implanted at erasing of the semiconductor memory cell according to the first embodiment of the present invention.
Figure 4:
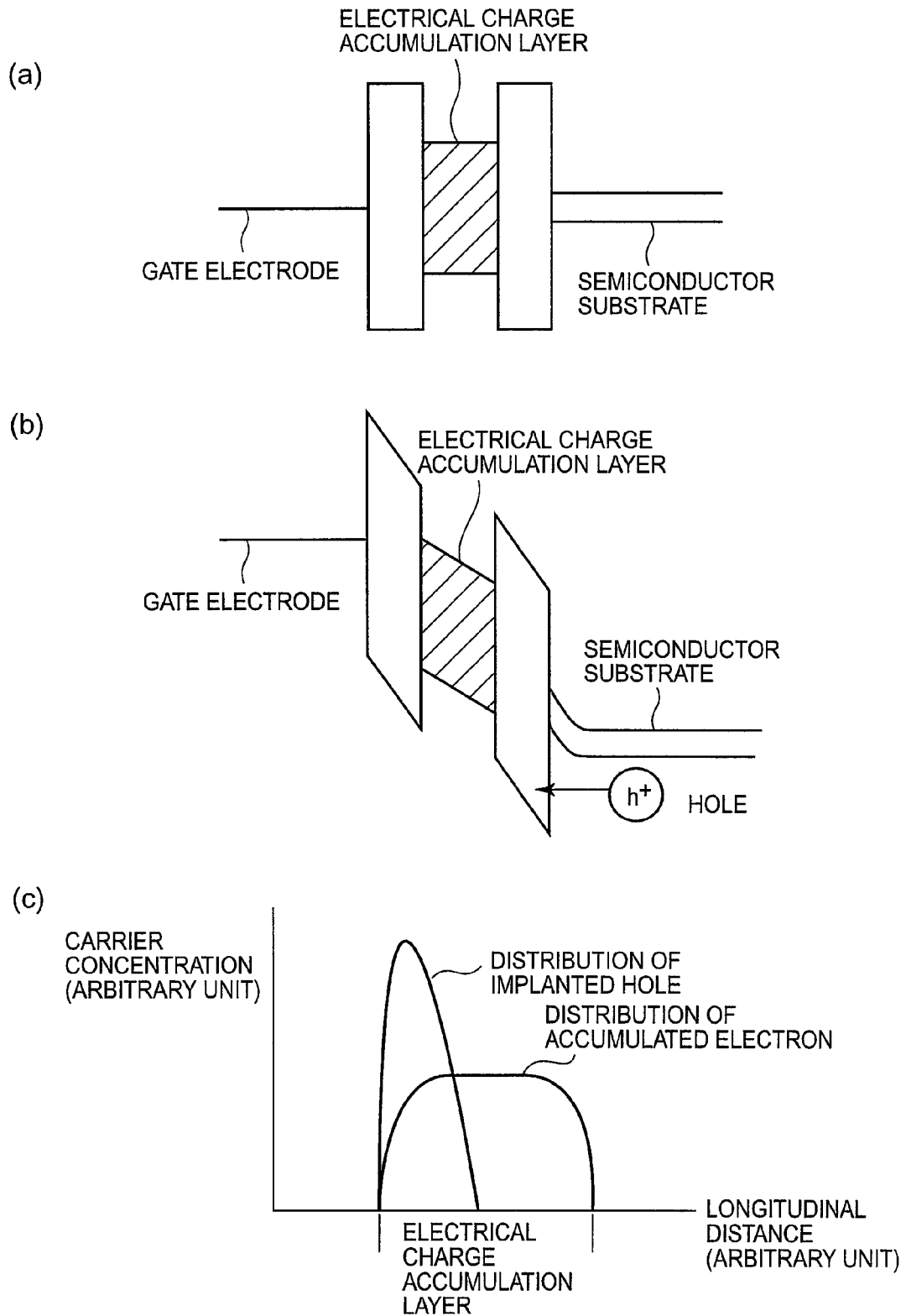
FIG. 4(a) is a view showing a band diagram of a semiconductor memory cell of a conventional example at no application of voltage.
FIG. 4(b) is a view showing a band diagram of the semiconductor memory cell of the conventional example at erasing.
FIG. 4(c) is a view showing a distribution of accumulated electrons and holes implanted at erasing of the semiconductor memory cell of the conventional example.
Figure 5:
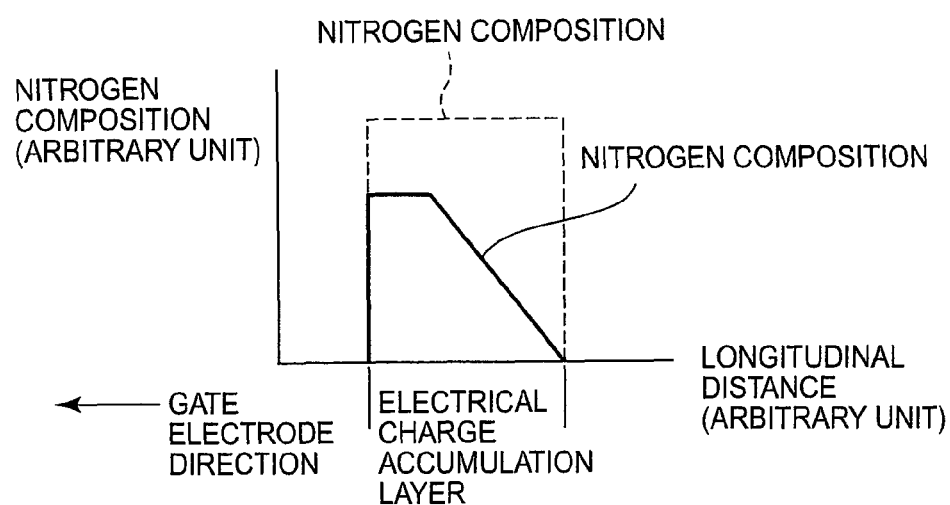
FIG. 5(a) is a view schematically showing another nitrogen composition profile in the nitrogen-containing silicon dioxide film of the semiconductor memory cell according to the first embodiment of the present invention.
FIG. 5(b) is a view schematically showing still another nitrogen composition profile in the nitrogen-containing silicon dioxide film of the semiconductor memory cell according to the first embodiment of the present invention.
Figure 5:
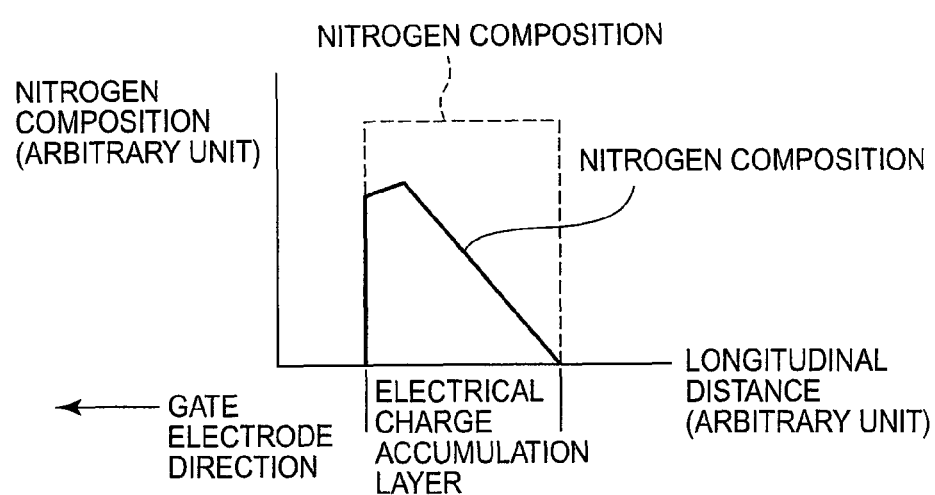

As can be seen from the above description, as shown in FIGS. 3 and 4, a clear different between distribution of the accumulated electrons in the memory cell of the present invention and distribution of the accumulated electrons in the memory cell of the conventional example exists, it is possible to speed up an erasing operation by using the memory cell of the structure of the present invention described above. In this regard, in addition to the profile of the nitrogen composition shown in FIG. 2, the similar effects can be expected by a profile in which it keeps a constant value or somewhat decreases after monotonously increasing as shown in FIG. 5. However, in the case where the profile keeps a constant value, it is desirable that a region (thickness) in which it is a constant value is as narrow as possible. In short, it is important that a profile of nitrogen composition is one in which the accumulated electrons are concentrated on the electrical charge accumulation layer near the gate electrode.

Figure 6:
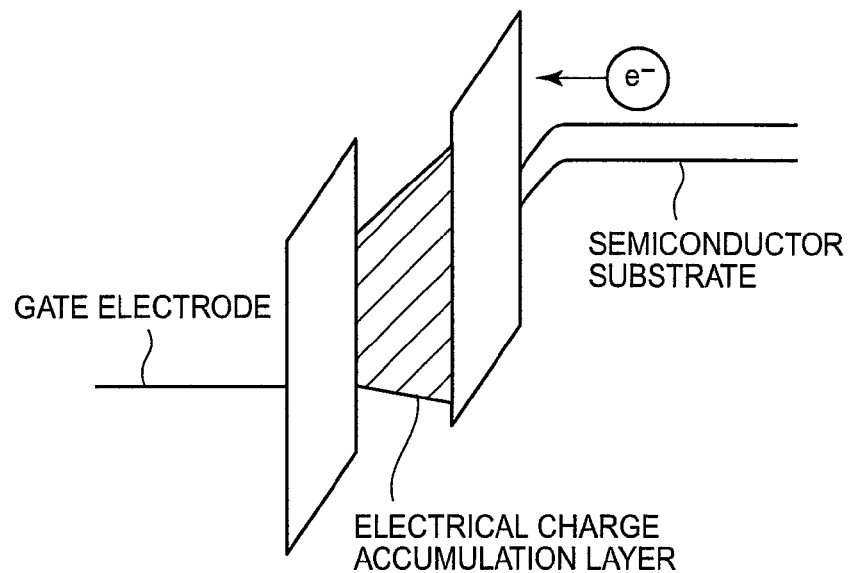
FIG. 6(a) is a view showing a band diagram at writing into the semiconductor memory cell according to the first embodiment of the present invention.
FIG. 6(b) is a view showing a band diagram at writing into a semiconductor memory cell having an electrical charge accumulation layer with a thin film thickness.
Figure 6:
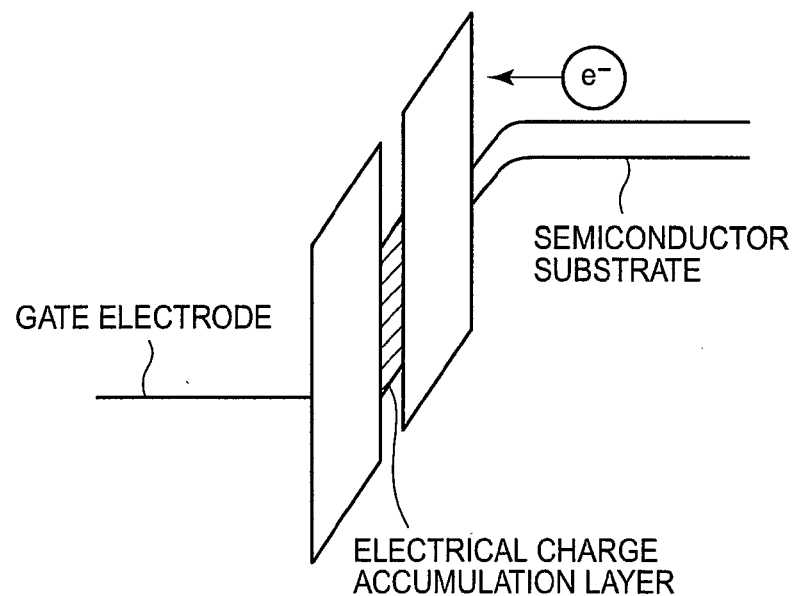

As described above, it is important that electrons are captured by restricting the accumulated electrons in a region in the film thickness direction in order to speed up an erasing operation. It is considered that there is a technique to make the electrical charge accumulation layer itself thin as an effective technique for this other than the structure of the semiconductor memory cell disclosed by the present invention. When this technique is compared with the technique of the present invention in view of a writing operation, it is obvious that the technique of the present invention is more advantageous. FIG. 6(a) is a band diagram at a writing operation according to the present invention, and FIG. 6(b) is a band diagram at a writing operation in the case where an electrical charge accumulation layer itself is thinned. As can be seen from FIG. 6(a), the hot electrons implanted by getting over a barrier of the silicon dioxide film from the semiconductor substrate are losing energy in the electrical charge accumulation layer, and finally they are accumulated at a trap level in the electrical charge accumulation layer. As described above, when electrons lose energy in the conduction band of the electrical charge accumulation layer, the electrons are captured in the electrical charge accumulation layer near the gate electrode. On the other hand, in the case where the electrical charge accumulation layer is thin, as shown in FIG. 6(b), the hot electrons implanted by getting over a barrier of the silicon dioxide film from the semiconductor substrate cannot be sufficiently losing energy in the electrical charge accumulation layer. Since the hot electrons that do not lose energy sufficiently are hardly captured in the electrical charge accumulation layer, this causes disadvantage for efficiency of writing. As can be seen from the above description, in the semiconductor memory device according to the present invention, writing is carried out by effectively capturing the electrons implanted as hot electrons, and erasing is also carried out effectively.

EXAMPLE 1

Figure 7:
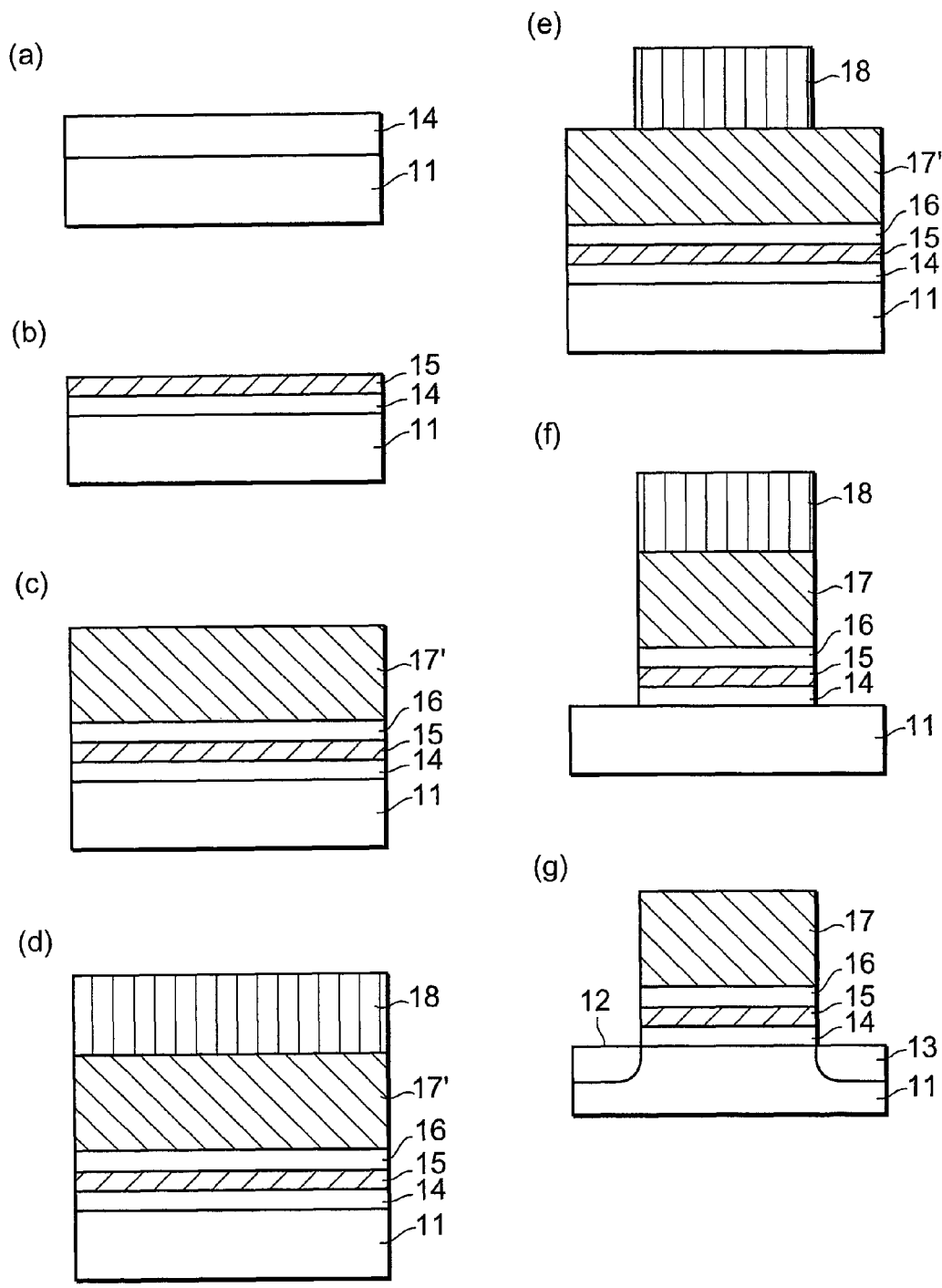
FIG. 7 is a sectional view of process order showing a method of manufacturing a semiconductor memory cell of Example 1 according to the first embodiment of the present invention.

FIG. 7 is a sectional view of process order showing a method of manufacturing the semiconductor memory cell 10 of Example 1 according to the first embodiment of the present invention.

A semiconductor substrate 11 is first prepared by means of a method well known as a method of manufacturing a conventional integrated circuit. As the semiconductor substrate 11, silicon, silicon on insulator (SOI) and the like are suitable. A silicon dioxide film 14 is formed on the semiconductor substrate 11 by means of a well-known method [FIG. 7(a)]. In the case where silicon or silicon on insulator is used for the semiconductor substrate 11, the silicon dioxide film 14 is formed by subjecting the semiconductor substrate 11 to thermal oxidation. The silicon dioxide film 14 may be a silicon oxynitride film containing a small amount of nitrogen at a side of the semiconductor substrate 11. It is suitable that a film thickness of the silicon dioxide film 14 is 4.5 nm or more.

Next, plasma of a gas containing nitrogen such as $N_2$, $NH_3$ or $N_2O$ is generated in a vacuum chamber, and nitrogen atoms are introduced to a surface of the silicon dioxide film 14. It is preferable that pressure in the chamber is about 1 mTorr to 1 Torr (0.133 to 133 Pa), and it is suitable that plasma power is about 100 W to 2 kW. Further, it is possible to apply voltage to the substrate so that radicalized nitrogen atoms have directivity and face the surface of the silicon dioxide film 14 when to introduce the nitrogen atoms. The surface of the silicon dioxide film 14 to which the nitrogen atoms are introduced becomes a nitrogen-containing silicon dioxide film 15 [FIG. 7(b)], and functions as an electrical charge accumulation layer. A thickness of the nitrogen-containing silicon dioxide film 15 may be 0.5 nm or more, and it is preferable that it is about 0.5 to 5 nm. In order to form a nonvolatile memory that retains information even when to turn off power, the thickness of the silicon dioxide film 14 remaining after formation of the nitrogen-containing silicon dioxide film 15 may be 4 nm or more.

In place of a method of exposing the silicon dioxide film 14 to a plasma atmosphere containing nitrogen, nitrogen can be introduced into the silicon dioxide film by subjecting the silicon dioxide film to thermal treatment in a high-temperature atmosphere containing nitrogen. $N_2$, $NH_3$, $N_2O$ and the like can be used as a nitrogen-containing gas for that.

A conductive material layer 17' for the silicon dioxide film 16 and the gate electrode is formed on the nitrogen-containing silicon dioxide film 15 [FIG. 7(c)]. If the silicon dioxide film 16 has, for example, 4 nm or more, it is sufficient as a nonvolatile semiconductor memory device. A method of forming a film such as a chemical vapor deposition method using a silane gas or $N_2O$ gas can be used suitably. Polysilicon formed by a silane gas, metal, metal silicide or a double-layered film of polycide or polysilicon and metal formed by means of a spattering method or the like is suitable for the conductive material layer 17'. It is enough that the film thickness is 50 nm or more.

Next, in order to form an etching mask, a photoresist film 18 is formed on the conductive material layer 17' [FIG. 7(d)].

The photoresist film 18 is exposed to light by means of optical exposure using a normal mask, and a development process is carried out, whereby the photoresist film 18 is processed to a desired gate pattern shape [FIG. 7(e)].

Processing of the conductive material layer 17', the silicon dioxide film 16, the nitrogen-containing silicon dioxide film 15 and the silicon dioxide film 14 is carried out using the photoresist film 18 with this gate pattern shape to form a first gate electrode 17 [FIG. 7(f)]. Although dry etching or wet etching can be used for processing, dry etching was used in this case.

By carrying out ion implantation against the gate insulation film constructed from the silicon dioxide film 14, the nitrogen-containing silicon dioxide film 15 and the silicon dioxide film 16 thus processed and the first gate electrode 17 formed on the silicon substrate 11 through the gate insulation film, a first impurity diffused layer 12 and a second impurity diffused layer 13 are formed in the semiconductor substrate 11 [FIG. 7(g)].

Figure 8:
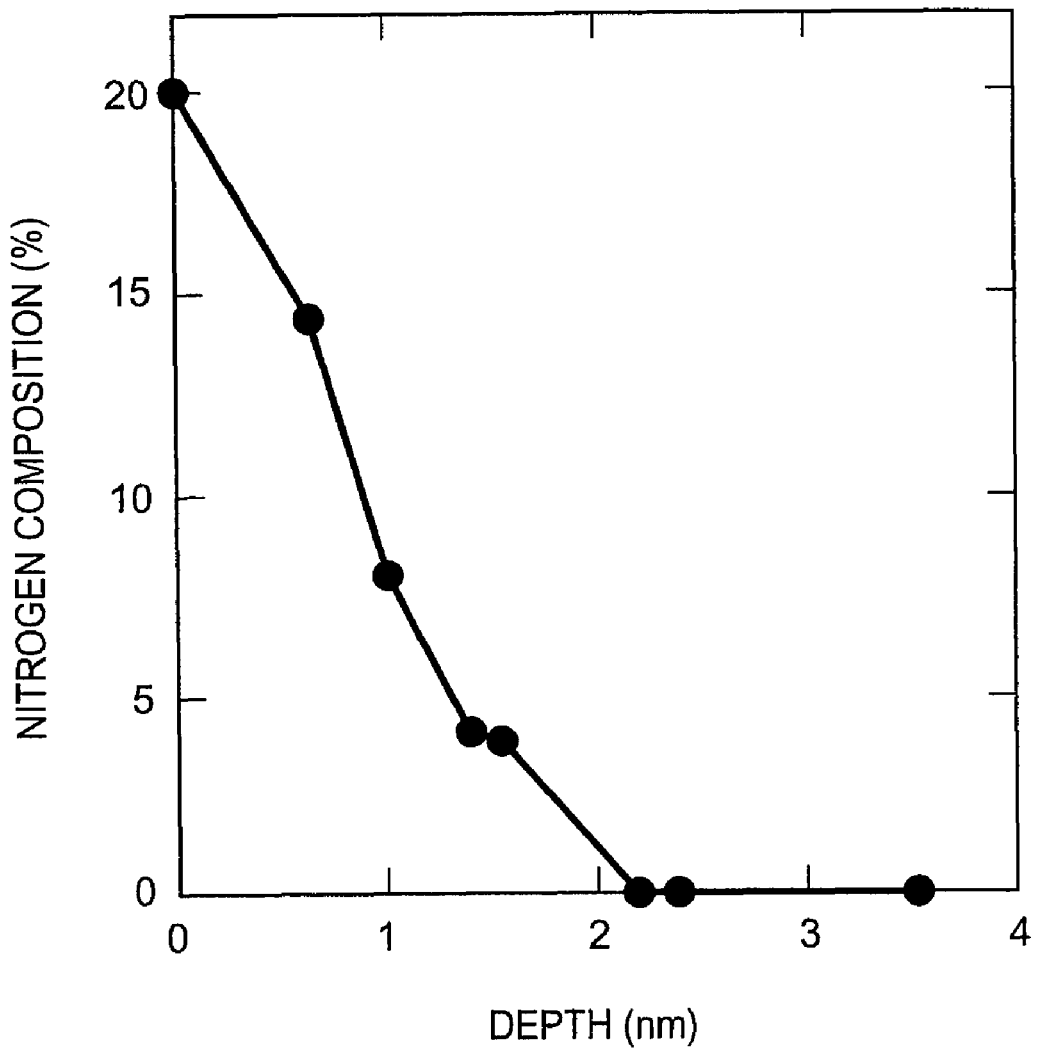
FIG. 8 is a graph showing measured values of nitrogen composition in the semiconductor memory cell of Example 1 according to the present invention.

FIG. 8 shows a nitrogen composition profile of the nitrogen-containing silicon dioxide film 15 in the semiconductor memory cell 10 according to Example 1 manufactured by the above method.

Figure 9:
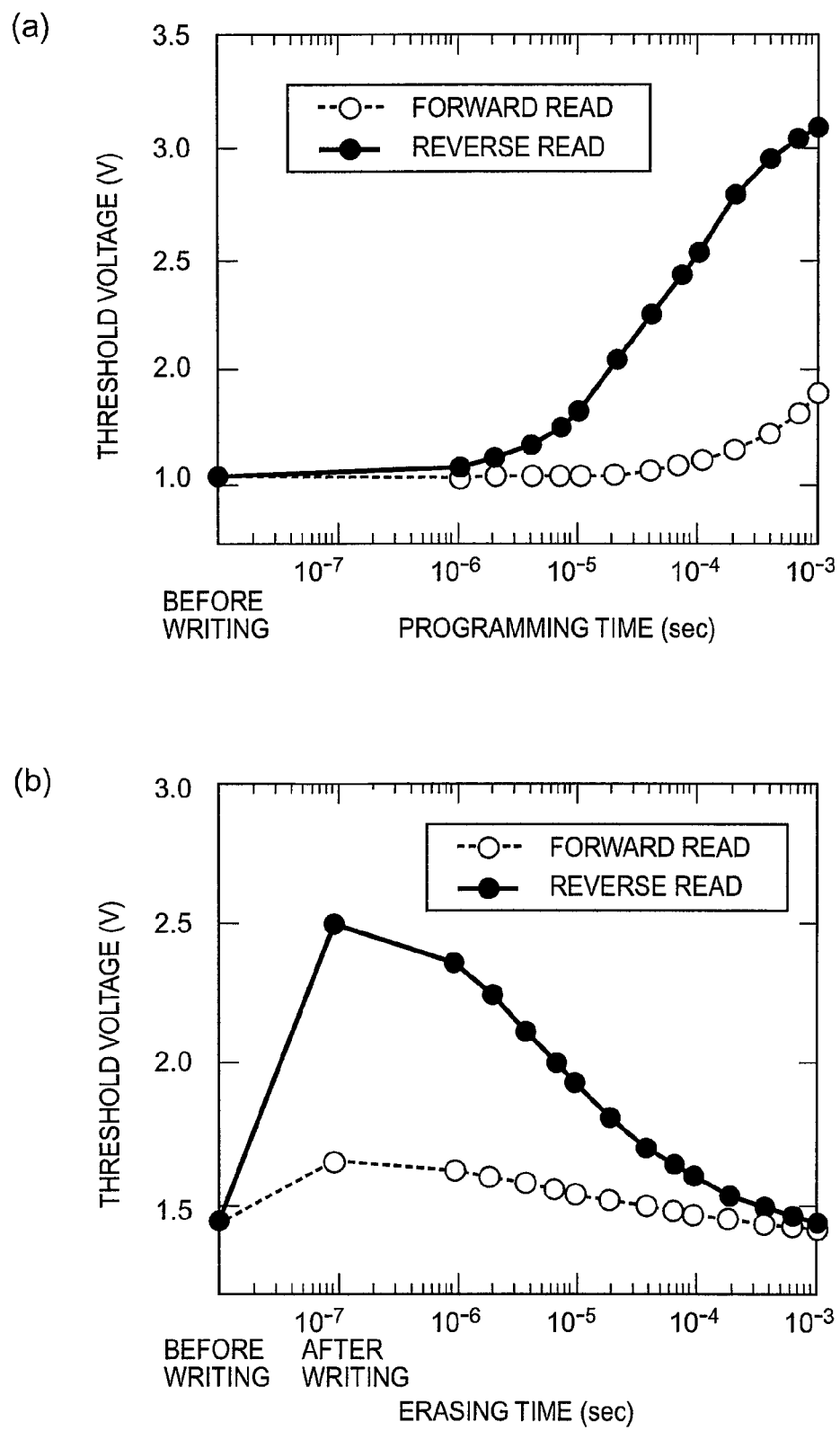
FIG. 9(a) is a graph showing a writing characteristic of the semiconductor memory cell of Example 1 according to the present invention.
FIG. 9(b) is a graph showing an erasing characteristic of the semiconductor memory cell of Example 1 according to the present invention.

From FIG. 8, nitrogen composition indicates about 20% at a side of the gate electrode as the maximum value, and attenuates to 0% until the depth of about 2.2 nm. In the semiconductor memory cell 10 formed using this nitrogen-containing silicon dioxide film 15, drain voltage and source voltage were respectively set to 4V and 0V, and CHE writing was carried out at gate voltage of 6V. As a function of a writing pulse width, threshold voltage of the semiconductor memory cell 10 changed as shown in FIG. 9(a). It is seen that reverse read threshold voltage (black circle) to which voltage of a reverse direction at writing is applied changes significantly, and forward read threshold voltage (white circle) to which voltage of a forward direction at writing is applied increases gradually. This indicates that local writing can be carried out in the semiconductor memory cell 10 according to Example 1 of the present invention.

Further, in the semiconductor memory cell 10, drain voltage and source voltage were respectively set to 4V and 0V, and hot hole erasing was carried out at gate voltage of −4V. As a function of an erasing pulse width, threshold voltage of the semiconductor memory device changed as shown in FIG. 9(b). It was indicated that both the reverse read threshold voltage (black circle) and forward read threshold voltage (white circle) described above decrease, and they return to a threshold value before writing for 1 msec ($10^{-3}$ seconds). Therefore, it was indicated that the semiconductor memory cell 10 according to Example 1 of the present invention complete an erasing operation for 1 msec. In the semiconductor memory device in which the nitrogen-containing silicon dioxide film 15 of the semiconductor memory cell 10 is converted into a conventional silicon nitride film, it took 100 msec until an erasing operation is completed. For this reason, in the semiconductor memory cell 10 according to the present invention, the erasing operation is speeded up dramatically.

Figure 10:
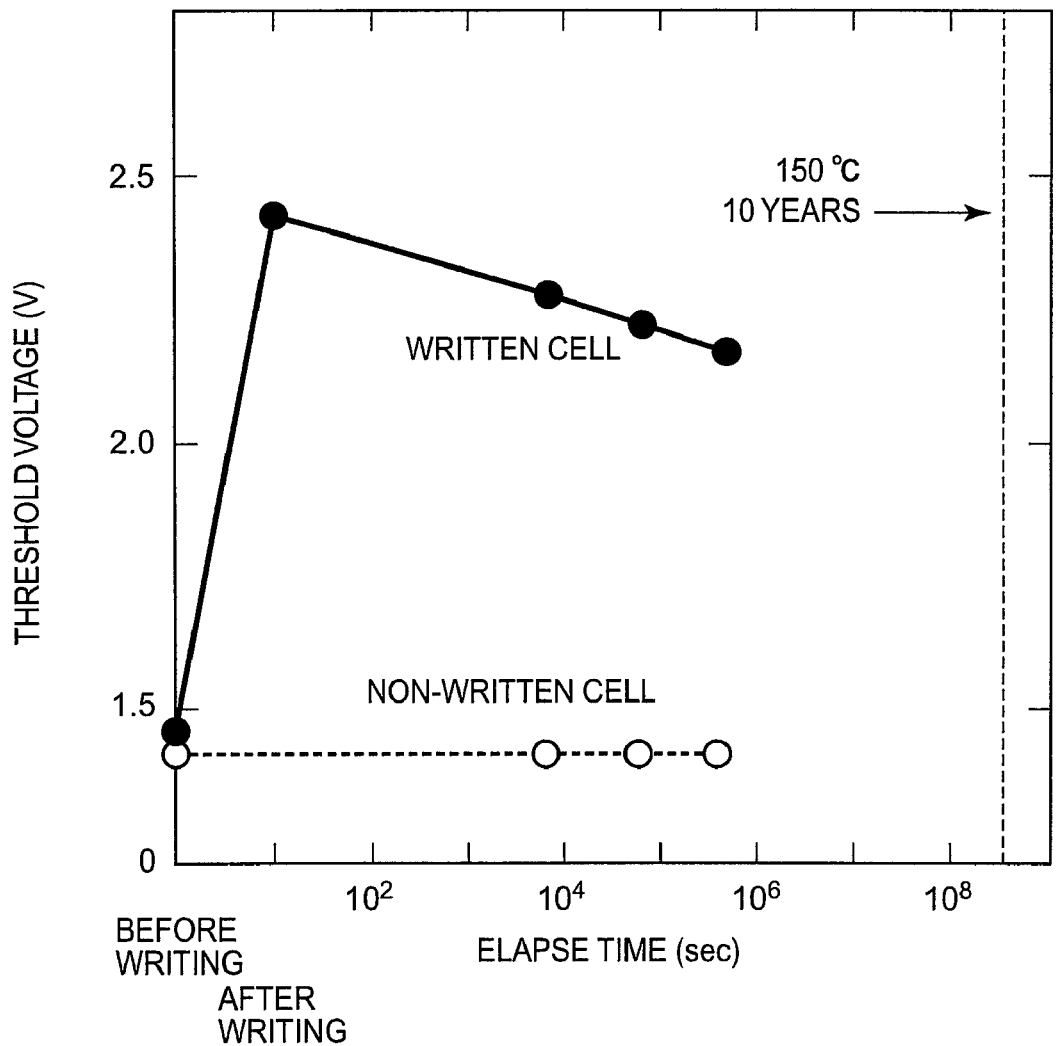
FIG. 10 is a graph showing a retention characteristic at 150° C. of the semiconductor memory cell of Example 1 according to the present invention.

Moreover, in a retention test at 150° C. of the semiconductor memory cell 10 according to Example 1 of the present invention, as shown in FIG. 10, only threshold voltage of a written cell decreases gradually, while threshold voltage of a non-written cell does not change at all. In FIG. 10, it is seen that writing information can be read out sufficiently after a lapse of 10 years in the case where it is extrapolated from measured data. Therefore, it is indicated that the semiconductor memory cell 10 according to Example 1 of the present invention has sufficient retention at 150° C.

In the semiconductor memory cell 10 according to Example 1 of the present invention, it was also found that variation in a threshold value at an erased state of about 1.5V that exists in the MONOS structure using the silicon nitride film according to the prior art is drastically reduced to about 0.3V. In the case where it is considered that supply voltage of an integrated circuit is lowered, it is an essential problem to reduce memory reading voltage embedded in an integrated circuit. As necessary matters for this, reduction of variation in a threshold value at an erased state is mentioned. When the threshold value is varied at the erased state, writing is carried out by taking a large margin in view of the variation. In other words, it is required to carry out writing so as to cause change in threshold voltage more than variation in a threshold value, and accumulation of electrical charges more than necessary is to be carried out. This accumulation of electrical charges more than necessary causes (1) rise in reading voltage of the semiconductor memory device, (2) instability of accumulated information because falling out of the electrical charges is increased at a high-temperature operation, and (3) deterioration in an S value, which indicates a current rising characteristic of the transistor, due to the accumulated electrical charges. Namely, reduction in variation in a threshold value, which is achieved by the present invention, is important as a semiconductor memory device.

EXAMPLE 2

Figure 11:
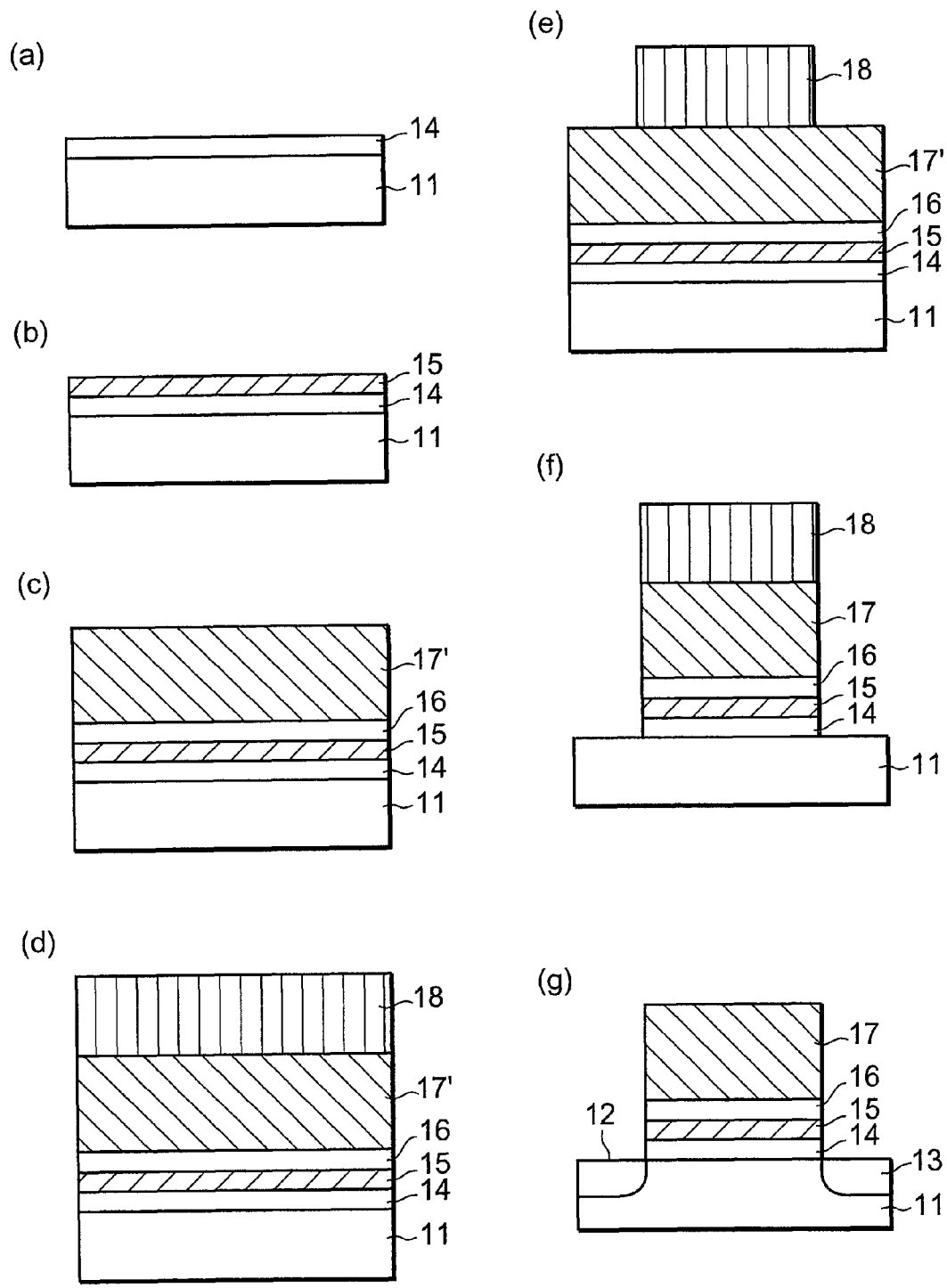
FIG. 11 is a sectional view of process order showing a method of manufacturing a semiconductor memory cell of Example 2 according to the first embodiment of the present invention.

FIG. 11 is a sectional view of process order showing a method of manufacturing the semiconductor memory cell 10 of Example 2 according to the first embodiment of the present invention.

A semiconductor substrate 11 is first prepared by means of a method well known as a method of manufacturing a conventional integrated circuit. As the semiconductor substrate 11, silicon, silicon on insulator (SOI) and the like are suitable. A silicon dioxide film 14 is formed on the semiconductor substrate 11 by means of a well-known method as a part of a gate insulation film [FIG. 11(a)]. In the case where silicon or silicon on insulator is used for the semiconductor substrate 11, the silicon dioxide film 14 is preferably formed by subjecting the semiconductor substrate 11 to thermal oxidation. Otherwise, a silicon oxynitride film to which a small amount of nitrogen is added, an insulation film with a high dielectric constant or the like can also be used. However, in the case of the insulation film with a high dielectric constant, one having a larger band gap is preferable. More specifically, one having the band gap of 5 eV or more is preferable, and, for example, alumina and the like are suitable. In the case of alumina, chemical vapor deposition using a raw gas or the like is suitable. Further, a laminated structure of the silicon dioxide film and the insulation film with a high dielectric constant described above can be used. In this case, there is no need to put the band gap of the insulation film with a high dielectric constant in question particularly. It is enough that the film thickness of the silicon dioxide film 14, which is a part of the gate insulation film, is 4 nm or more.

Figure 12:
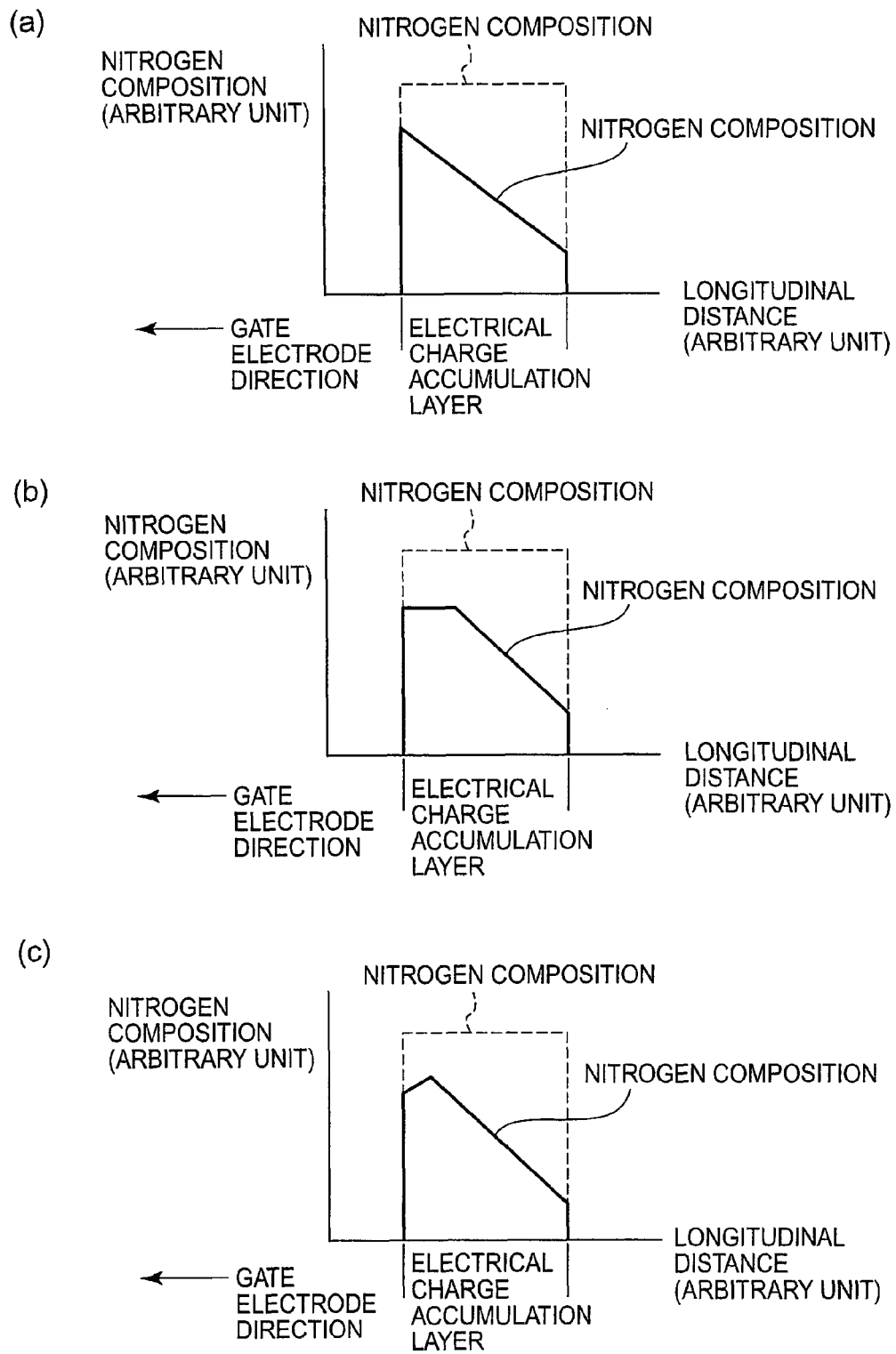
FIG. 12 is a view schematically showing still another nitrogen composition profile in the nitrogen-containing silicon dioxide film of the semiconductor memory cell according to the first embodiment of the present invention.

Next, a nitrogen-containing silicon dioxide film 15 is formed using chemical vapor deposition while changing a mixture ratio of a gas that is a raw material of nitrogen, a gas that is a raw material of silicon and a gas that is a raw material of oxygen [FIG. 11(b)]. Ammonia is suitable for a raw gas of nitrogen, and silane, dichlorosilane or the like is suitable for a raw gas of silicon. Oxygen, $N_2O$ or the like is suitable for a raw gas of oxygen. It is preferable that nitrogen composition in the nitrogen-containing silicon dioxide film 15 has a form shown by a solid line in FIG. 2, FIG. 5, or FIG. 12. A thickness of the nitrogen-containing silicon dioxide film 15 may be 0.5 nm or more, and it is preferable that it is about 0.5 to 5 nm.

A conductive material layer 17' for forming a silicon dioxide film 16 that is a part of the gate insulation film and a gate electrode is formed on the nitrogen-containing silicon dioxide film 15 [FIG. 11(c)]. It is enough that the silicon dioxide film 16 has a thickness of 4 nm or more, for example, to form a nonvolatile semiconductor memory device. A chemical vapor deposition method using silane gas or $N_2O$ gas and the like can be applied to film formation of the silicon dioxide film suitably. In place of the silicon dioxide film, a silicon oxynitride film to which a small amount of nitrogen is added, an insulation film with a high dielectric constant or the like can also be used. However, in the case of the insulation film with a high dielectric constant, one having a larger band gap is preferable. More specifically, one having the band gap of 5 eV or more is preferable, and, for example, alumina and the like are suitable. In the case of alumina, chemical vapor deposition using a raw gas or the like is suitable. Further, a laminated structure of the silicon dioxide film and the insulation film with a high dielectric constant described above or a laminated structure of silicon dioxide film/silicon nitride film/silicon dioxide film (ONO) can also be used. Polysilicon formed by a silane gas, metal, metal silicide or the like formed by a spattering method or the like is suitable for the conductive material layer 17'. It is enough that the film thickness is 50 nm or more. Further, a laminated film of polysilicon and silicide or metal can also be used.

Next, in order to subject the conductive material layer 17' to patterning, a photoresist film 18 is formed on the conductive material layer 17' [FIG. 11(d)].

The photoresist film 18 is exposed to light by means of optical exposure using a normal mask, and a development process is carried out, whereby the photoresist film 18 is subjected to patterning to a desired gate pattern shape [FIG. 11(e)].

Processing of the conductive material layer 17', the silicon dioxide film 16, the nitrogen-containing silicon dioxide film 15 and the silicon dioxide film is carried out using the photoresist film 18 with this gate pattern shape to form a first gate electrode 17 [FIG. 11(f)]. Although either dry etching or wet etching can be used for processing, a dry method was used in this case.

Next, by carrying out ion implantation using the first gate electrode 17 and the gate insulation film as a mask, a first impurity diffused layer 12 and a second impurity diffused layer 13 were formed in the semiconductor substrate 11 [FIG. 11(g)].

In the semiconductor memory device according to the first embodiment of the present invention manufactured as described above, a sufficient high-speed erasing operation can be achieved compared with the MONOS type semiconductor memory device using the conventional silicon nitride film.

Second Embodiment

Figure 13:
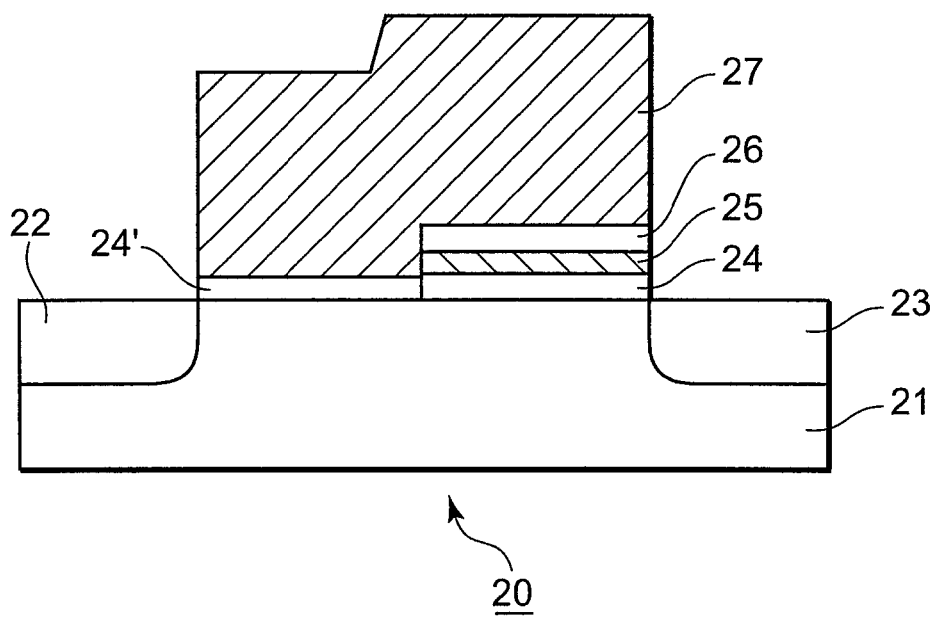
FIG. 13 is a sectional view showing a structure of a semiconductor memory cell according to a second embodiment of the present invention.

FIG. 13 is a sectional view showing a structure of a semiconductor memory cell 20 according to a second embodiment of the present invention.

As shown in 13, a semiconductor memory cell 20 includes: a semiconductor substrate 21; a first impurity diffused layer 22 and a second impurity diffused layer 23 formed in the semiconductor substrate 21; a first gate insulation film constructed from a silicon dioxide film 24, a nitrogen-containing silicon dioxide film 25 and silicon dioxide film 26 formed on the semiconductor substrate 21 near the second impurity diffused layer 23, a second gate insulation film 24' composed of a silicon dioxide film formed on the semiconductor substrate 21 near the first impurity diffused layer 22; and a first gate electrode 27 formed on the semiconductor substrate 21 so as to be mounted on the first and second gate insulation films. Here, nitrogen composition in the nitrogen-containing silicon dioxide film 25 increases from a side of the semiconductor substrate 21 toward the first gate electrode 27. The silicon dioxide films 24, 26 and the second gate insulation film 24' may be a laminated film of an insulation film with a high dielectric constant or a silicon dioxide film and an insulation film with a high dielectric constant in place of the silicon dioxide film.

Third Embodiment

Figure 14:
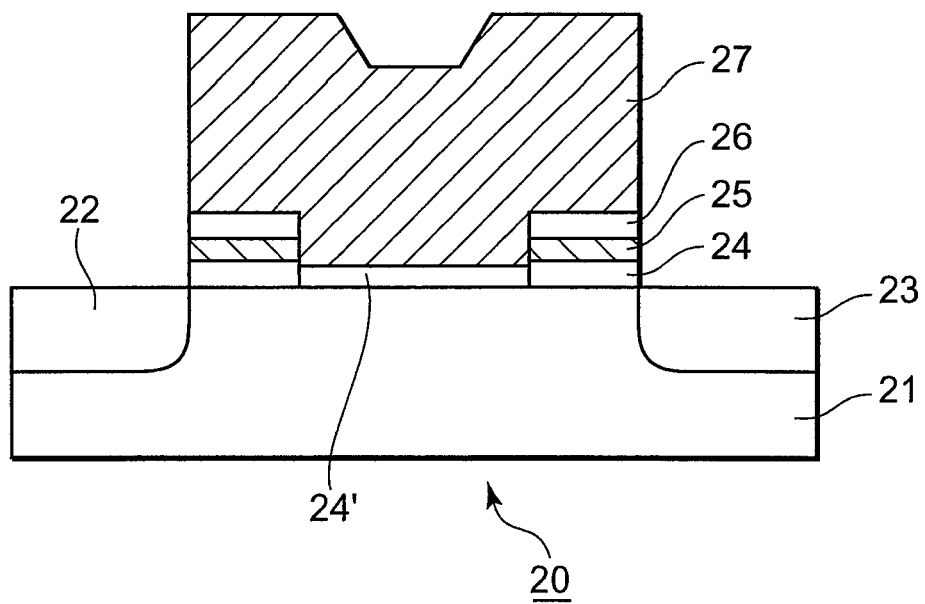
FIG. 14 is a sectional view showing a structure of a semiconductor memory cell according to a third embodiment of the present invention.

FIG. 14 is a sectional view showing a structure of a semiconductor memory cell 20 according to a third embodiment of the present invention. In FIG. 14, the same reference numerals are attached to parts similar to the parts of FIG. 13 that shows the second embodiment, and overlapping description will be omitted. Much the same is true on the following embodiments.

In the present embodiment, a first gate electrode 27 is formed so as to be mounted on a first gate insulation film having a nitrogen-containing silicon dioxide film 25 and a second gate insulation film 24' not having a nitrogen-containing silicon dioxide film. The first gate insulation film is formed near a first impurity diffused layer 22 and a second impurity diffused layer 23, and the second gate insulation film 24' is formed in the center portion on a channel region.

Fourth Embodiment

Figure 15:
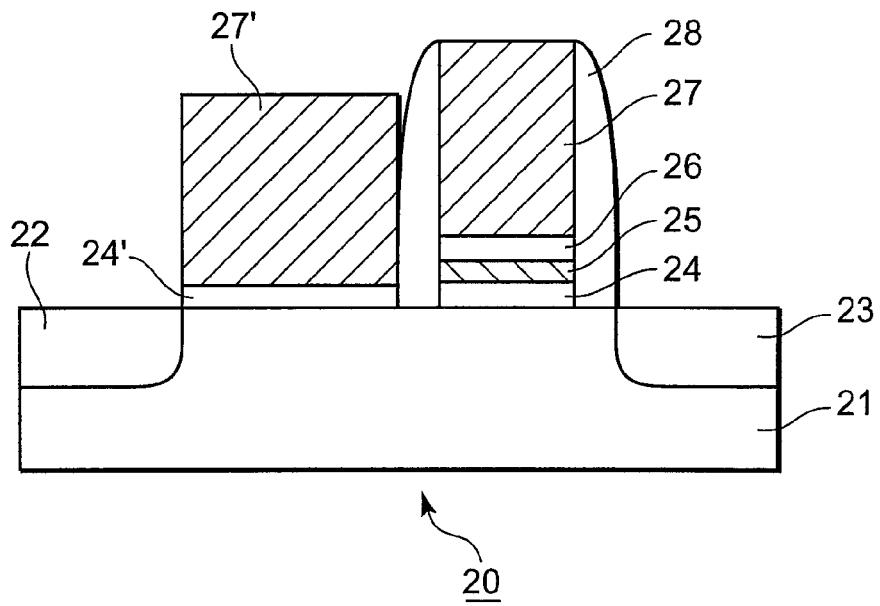
FIG. 15 is a sectional view showing a structure of a semiconductor memory cell according to a fourth embodiment of the present invention.

FIG. 15 is a sectional view showing a structure of a semiconductor memory cell 20 according to a fourth embodiment of the present invention.

In the present embodiment, a gate electrode is formed so as to be divided into two parts of a first gate electrode 27 and a second gate electrode 27'. The first gate electrode 27 is formed on a first gate insulation film having a nitrogen-containing silicon dioxide film 25, and the second gate electrode 27' is formed on a second gate insulation film 24' not having a nitrogen-containing silicon dioxide film. Here, side surfaces of the first gate electrode 27 are covered with a sidewall insulation film 28.

Fifth Embodiment

Figure 16:
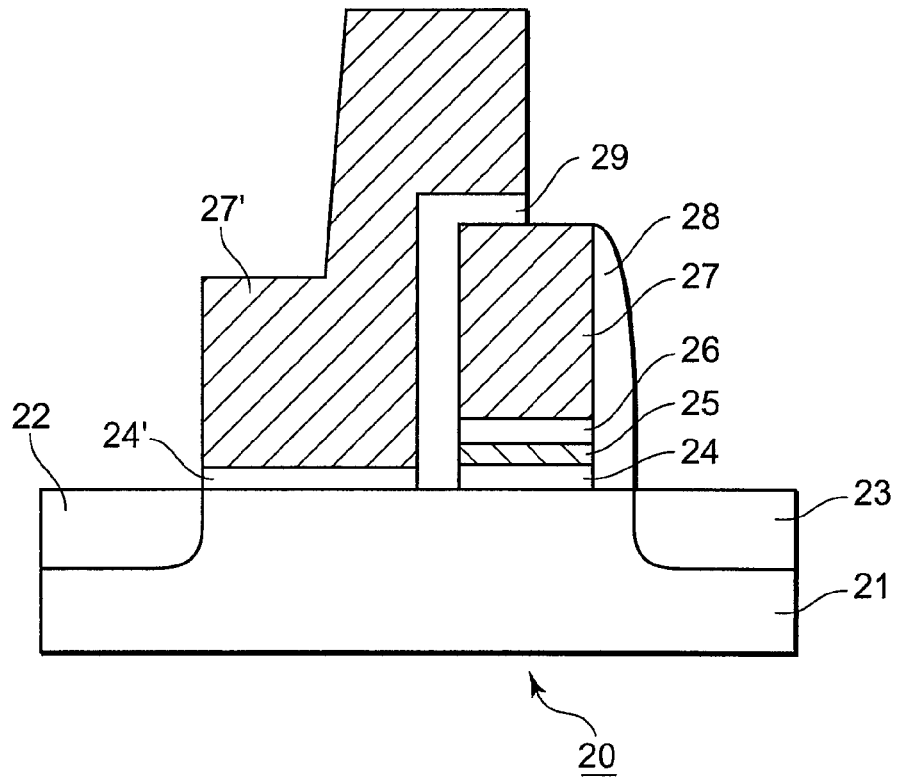
FIG. 16 is a sectional view showing a structure of a semiconductor memory cell according to a fifth embodiment of the present invention.

FIG. 16 is a sectional view showing a structure of a semiconductor memory cell 20 according to a fifth embodiment of the present invention.

In the present embodiment, a first gate electrode 27 is formed on a first gate insulation film having a nitrogen-containing silicon dioxide film 25, and a second gate electrode 27' is formed on a second gate insulation film 24' not having a nitrogen-containing silicon dioxide film. Further, a part of the second gate electrode 27' is formed so as to mount on the first gate electrode 27, and the first gate electrode 27 is separated from the second gate electrode 27' by an insulation film 29. Moreover, the side of the first gate electrode 27 opposite to the second gate electrode 27' is covered with a sidewall insulation film 28.

Sixth Embodiment

Figure 17:
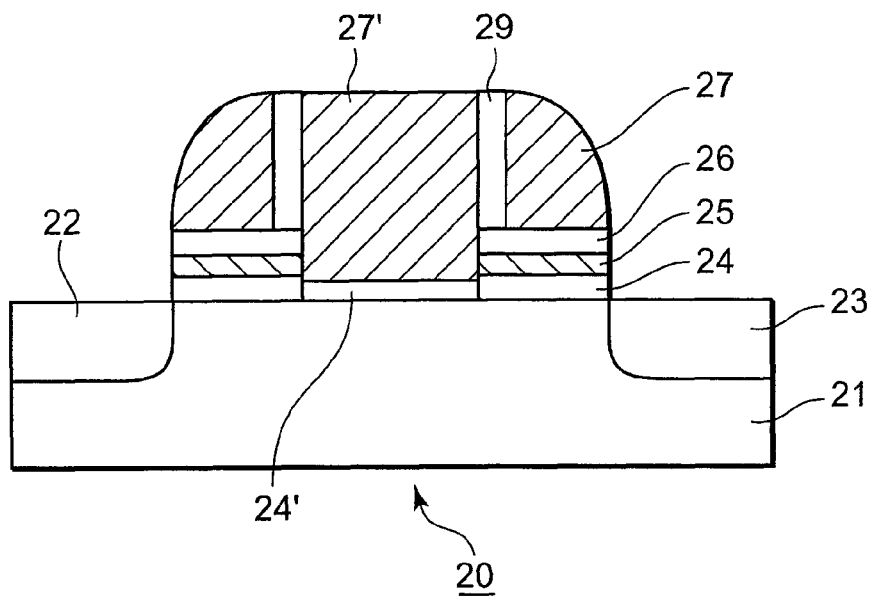
FIG. 17 is a sectional view showing a structure of a semiconductor memory cell according to a sixth embodiment of the present invention.
Figure 18:
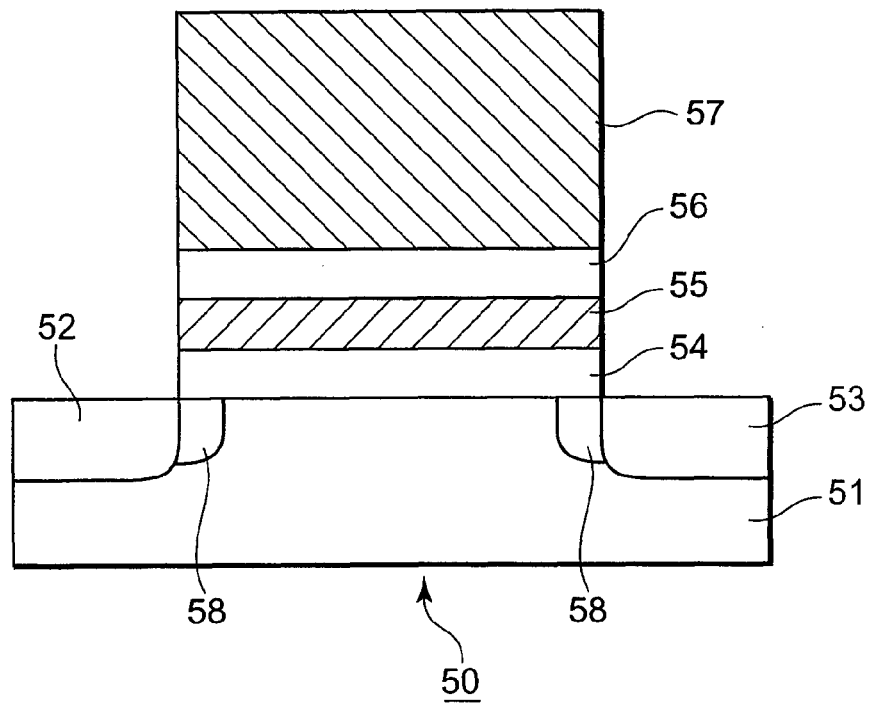
FIG. 18 is a sectional view showing a structure of a semiconductor memory cell according to a conventional example of the present invention.

FIG. 17 is a sectional view showing a structure of a semiconductor memory cell 20 according to a sixth embodiment of the present invention.

In the present embodiment, a second gate electrode 27' is formed on a second gate insulation film 24' not having a nitrogen-containing silicon dioxide film, and first gate electrodes 27 are formed at both sides thereof and on first gate insulation films each having a nitrogen-containing silicon dioxide film 25 in the form of a sidewall film. Insulation films 29 are formed between each of the first gate electrodes 27 and the second gate electrode 27'. A silicon dioxide film is preferable for this insulation film 29, but a nitrogen-containing silicon dioxide film may be included therein.

In the semiconductor memory cell according to each of the second to sixth embodiments of the present invention described above, a sufficient high-speed erasing operation can also be achieved compared with the MONOS type semiconductor memory device using the conventional silicon nitride film.

Even in the case where the maximum value of the nitrogen composition in the nitrogen-containing silicon dioxide film in the semiconductor memory cell according to each of the second to sixth embodiments of the present invention becomes 100%, that is, it becomes a silicon nitride film at a gate side, the semiconductor memory cell can operate. However, a quiet satisfactory characteristic can be obtained even if the maximum value is 7% or more but less than 35%. Further, a rate of change in the nitrogen composition was 5% or more but less than 30% per a film thickness of 1 nm of the nitrogen-containing silicon dioxide film, and it was sufficient.

Moreover, in a manufacturing process of the semiconductor memory device according to each of the first to sixth embodiments of the present invention, by carrying out thermal treatment in an oxidizing atmosphere after formation of the nitrogen-containing silicon nitride film, nitrogen composition in the nitrogen-containing silicon dioxide film can be stabilized and a film quality can be improved. This allows stabilization of an operation of the semiconductor memory device according to each of the first to sixth embodiments of the present invention. Further, this stabilization of the operation can also be achieved by forming a nitrogen-containing silicon nitride film and exposing it to plasma in an oxidizing atmosphere. Moreover, in the manufacturing process of the semiconductor memory device according to each of the first to sixth embodiments of the present invention, by carrying out thermal treatment in a hydrogen atmosphere after formation of the nitrogen-containing silicon nitride film, high-temperature retention of the semiconductor memory device according to each of the first to sixth embodiments of the present invention can be improved.

Moreover, the semiconductor memory cells according to each of the first to sixth embodiments of the present invention configure a memory array so as to be arranged in a matrix manner. This memory array may be mounted in combination with a logic circuit or logic and other memory (such as DRAM, SRAM), and it can also be used for a nonvolatile memory dedicated IC. In this regard, in order to use it as a nonvolatile semiconductor memory device, it is preferable that a part of the gate insulation film existing at both sides of the nitrogen-containing silicon dioxide film, which is an electrical charge accumulation layer, or a thickness of the silicon dioxide film is 4 nm or more. On the other hand, a part of the gate insulation film or a thickness of the silicon dioxide film may be less than 4 nm. It can be used as a new type of semiconductor memory device that is not nonvolatile but can carry out writing and erasing at high speed, and whose retention is longer than that of a conventional DRAM, that is, that has long refresh time.

Further, although the nitrogen-containing silicon dioxide film has been used as the electrical charge trapping layer in the above embodiments, a layer containing a material other than nitrogen, such as aluminum or alumina, can also be used as the electrical charge trapping layer.

INDUSTRIAL APPLICABILITY

The present invention can be applied to a semiconductor memory device having a plurality of semiconductor memory cells each of which can hold information by capturing an electrical charge at a trap level in a gate insulation film, in particular, an MONOS type semiconductor memory device. By applying the present invention thereto, erasing speed can be speeded up first, variation in a threshold voltage after erasing can be reduced second, and movement of a carrier after programming can be controlled third, and therefore it is extremely useful.

The invention claimed is:

1. A semiconductor memory device comprising a plurality of memory cells each carrying out a storing operation by capturing an electrical charge in a gate insulation film, the memory cell, comprising:
a semiconductor substrate; first and second impurity diffused layers formed in the semiconductor substrate; a gate insulation film formed on the semiconductor substrate; and a first gate electrode formed on the semiconductor substrate through the gate insulation film, the gate insulation film having a nitrogen-containing silicon dioxide film therein, a periphery of the nitrogen-containing silicon dioxide film being enclosed by an insulation film having a band gap higher than that of the nitrogen-containing silicon dioxide film, nitrogen composition in the nitrogen-containing silicon dioxide film becoming higher at a side of the first gate electrode compared with a side of the semiconductor substrate.

2. The semiconductor memory device as claimed in claim 1, wherein the nitrogen composition in the nitrogen-containing silicon dioxide film increases from the side of the semiconductor substrate toward the side of the first gate electrode.

3. The semiconductor memory device as claimed in claim 1, wherein the gate insulation film is constructed from at least three layers of insulation films, three layers of the gate insulation film at the side of the semiconductor substrate being a silicon dioxide film, the nitrogen-containing silicon dioxide film and an insulation film having a band gap larger than that of the nitrogen-containing silicon dioxide film.

4. The semiconductor memory device as claimed in claim 3, wherein the gate insulation film, is constructed from the silicon dioxide film, the nitrogen-containing silicon dioxide film and a silicon dioxide film from the side of the semiconductor substrate.

5. The semiconductor memory device as claimed in claim 1, wherein the nitrogen composition in the nitrogen-containing silicon dioxide film becomes maximal at a specific portion near the first gate electrode.

6. The semiconductor memory device as claimed in claim 1, wherein a region in which the nitrogen composition in the nitrogen-containing silicon dioxide film monotonously increases from a side of the semiconductor substrate toward the first gate electrode exists.

7. The semiconductor memory device as claimed in claim 1, wherein the nitrogen composition in the nitrogen-containing silicon dioxide film increases from a side of the semiconductor substrate from 0%.

8. The semiconductor memory device as claimed in claim 1, wherein an entire first gate electrode is formed on the gate insulation film having the nitrogen-containing silicon dioxide film.

9. The semiconductor memory device as claimed in claim 1, wherein a part of the first gate electrode is formed on the gate insulation film having the nitrogen-containing silicon dioxide film, and the other part of the first gate electrode is formed on a second gate insulation film not having the nitrogen-containing silicon dioxide film.

10. The semiconductor memory device as claimed in claim 9, wherein the gate insulation film having the nitrogen-containing silicon dioxide film is formed near any one of the first and second impurity diffused layers, and the second gate insulation film not having the nitrogen-containing silicon dioxide film is formed near the other of the first and second impurity diffused layers.

11. The semiconductor memory device as claimed in claim 9, wherein the second gate insulation film not having the nitrogen-containing silicon dioxide film is formed on the semiconductor substrate between the first and second impurity diffused layers, and the gate insulation film having the nitrogen-containing silicon dioxide film is formed at both sides thereof.

12. The semiconductor memory device as claimed in claim 1, wherein the first gate electrode and a second gate electrode are provided on the semiconductor substrate between the first and second impurity diffused layers, and the second gate electrode is formed on a second gate insulation film not having the nitrogen-containing silicon dioxide film.

13. The semiconductor memory device as claimed in claim 12, wherein a part of the second gate electrode is formed so as to mount on the first gate electrode.

14. The semiconductor memory device as claimed in claim 12, wherein the second gate electrode is formed on the semiconductor substrate between the first and second impurity diffused layers, and the first gate electrode is formed at both sides of the second gate electrode so as to put the second gate electrode there between.

15. The semiconductor memory device as claimed in claim 1, wherein at least a part of the gate insulation film that isolates the nitrogen-containing silicon dioxide film from the gate electrode is composed of an insulation film with a high dielectric constant.

16. The semiconductor memory device as claimed in claim 1, wherein at least a part of the gate insulation film that isolates the nitrogen-containing silicon dioxide film from the gate electrode is composed of a laminated structure constructed from a silicon dioxide film, a silicon nitride film and a silicon dioxide film.

17. The semiconductor memory device as claimed in claim 1, wherein a maximum value of the nitrogen composition in the nitrogen-containing silicon dioxide film is 7% or more but less than 35%.

18. The semiconductor memory device as claimed in claim 1, wherein a rate of change of the nitrogen composition in the nitrogen-containing silicon dioxide film is 5% or more but less than 30% per nm of a film thickness of the nitrogen-containing silicon dioxide film.

19. The semiconductor memory device as claimed in claim 1, wherein a space between the nitrogen-containing silicon dioxide film and the semiconductor substrate is 4 nm or more.

20. The semiconductor memory device as claimed in claim 1, wherein a space between the nitrogen-containing silicon dioxide film and the semiconductor substrate is less than 4 nm.

21. The semiconductor memory device as claimed in claim 1, wherein a space between the nitrogen-containing silicon dioxide film and the first gate electrode is 4 nm or more.

22. The semiconductor memory device as claimed in claim 1, wherein a space between the nitrogen-containing silicon dioxide film and the first gate electrode is less than 4 nm.

23. The semiconductor memory device as claimed in claim 1, wherein the memory cell is formed on one region of the semiconductor substrate, and a logic circuit is formed on the other region of the semiconductor substrate.

24. A method of driving the semiconductor memory device as claimed in claim 1, the method comprising:
generating a hot carrier in the vicinity of the first or second impurity diffused layer by applying voltage of first specific voltage or more between the first and second impurity diffused layers formed in the semiconductor substrate and applying voltage whose absolute value is second specific voltage or more to the first gate electrode; and carrying out a writing or erasing operation by locally implanting the hot carrier into the nitrogen-containing layer.

25. The semiconductor memory device as claimed in claim 24, wherein the memory cell is formed on one region of the semiconductor substrate, and a logic circuit is formed on the other region of the semiconductor substrate.

26. A semiconductor memory device comprising a plurality of memory cells each carrying out a storing operation by capturing an electrical charge in a gate insulation film, the memory cell comprising:
a semiconductor substrate; first and second impurity diffused layers formed in the semiconductor substrate; a gate insulation film formed on the semiconductor substrate; and a first gate electrode formed on the semiconductor substrate through the gate insulation film, the gate insulation film having a nitrogen-containing silicon dioxide film therein, a periphery of the nitrogen-containing silicon dioxide film being enclosed by an insulation film, having a band gap higher than that of the nitrogen-containing silicon dioxide film, nitrogen composition in the nitrogen-containing silicon dioxide film continuously changing in a direction, perpendicular to the semiconductor substrate, a portion in which the nitrogen composition becomes maximal existing at a specific portion in which a distance from the first gate electrode being less than half of a film thickness of the nitrogen-containing silicon dioxide film.

27. A method of manufacturing the semiconductor memory device as claimed in claim 26, wherein a method of forming the nitrogen-containing silicon dioxide film includes forming a silicon dioxide film on the semiconductor substrate or the gate insulation film, and exposing the silicon dioxide film to plasma in which a gas containing nitrogen atoms is excited by a microwave.

28. The method as claimed in claim 27, wherein the gas containing the nitrogen atoms is $N_2$, $NH_3$ or $N_2O$.

29. The method as claimed in claim 28, wherein thermal treatment is carried out in an oxidizing atmosphere after forming the nitrogen-containing silicon dioxide film.

30. The method as claimed in claim 28, wherein thermal treatment is carried out in a hydrogen atmosphere after forming the nitrogen-containing silicon dioxide film.

31. The method as claimed claim 28, wherein, after forming the nitrogen-containing silicon dioxide film, the nitrogen-containing silicon dioxide film is exposed to plasma in which an oxidizing atmosphere is excited by a microwave.

32. The method as claimed in claim 27, wherein thermal treatment is carried out in an oxidizing atmosphere after forming the nitrogen-containing silicon dioxide film.

33. The method as claimed in claim 27, wherein thermal treatment is carried out in a hydrogen atmosphere after forming the nitrogen-containing silicon dioxide film.

34. The method as claimed claim 27, wherein, after forming the nitrogen-containing silicon dioxide film, the nitrogen-containing silicon dioxide film is exposed to plasma in which an oxidizing atmosphere is excited by a microwave.

35. The method as claimed in claim 27, wherein the method of forming the nitrogen-containing silicon dioxide film includes applying voltage to the semiconductor substrate when the silicon dioxide film is exposed to the plasma.

36. A method of manufacturing the semiconductor memory device as claimed in, claim 26, wherein a method of forming the nitrogen-containing silicon dioxide film includes forming a silicon dioxide film on the semiconductor substrate or the gate insulation film, and subjecting the silicon dioxide film to thermal treatment in a gas containing nitrogen, atoms at high temperature.

37. The method as claimed in claim 36, wherein the gas containing the nitrogen atoms is $N_2$, $NH_3$ or $N_2O$.

38. The method as claimed in claim 37, wherein thermal treatment is carried out in an oxidizing atmosphere after forming the nitrogen-containing silicon dioxide film.

39. The method as claimed in claim 37, wherein thermal treatment is carried out in a hydrogen atmosphere after forming the nitrogen-containing silicon dioxide film.

40. The method as claimed in claim 37, wherein, after forming the nitrogen-containing silicon dioxide film, the nitrogen-containing silicon dioxide film is exposed to plasma in which an oxidizing atmosphere is excited by a microwave.

41. The method as claimed in claim 36, wherein thermal treatment is carried out in an oxidizing atmosphere after forming the nitrogen-containing silicon dioxide film.

42. The method as claimed in claim 36, wherein thermal treatment is carried out in a hydrogen atmosphere after forming the nitrogen-containing silicon dioxide film.

43. The method as claimed claim 36, wherein, after forming the nitrogen-containing silicon dioxide film, the nitrogen-containing silicon dioxide film is exposed to plasma in which an oxidizing atmosphere is excited by a microwave.

44. A method of manufacturing the semiconductor memory device as claimed in claim 26, wherein a method of forming the nitrogen-containing silicon dioxide film includes forming the nitrogen-containing silicon dioxide film using chemical vapor deposition while changing a mixture ratio between a gas that is a raw material of nitrogen, a gas that is a raw material of silicon and a gas that is a raw material of oxygen.

45. The method as claimed in claim 44, wherein thermal treatment is carried out in an oxidizing atmosphere after forming the nitrogen-containing silicon dioxide film.

46. The method as claimed in claim 44, wherein thermal treatment is carried out in a hydrogen atmosphere after forming the nitrogen-containing silicon dioxide film.

47. The method as claimed claim 44, wherein, after forming the nitrogen-containing silicon dioxide film, the nitrogen-containing silicon dioxide film is exposed to plasma in which an oxidizing atmosphere is excited by a microwave.

48. The semiconductor memory device as claimed in claim 26, wherein an entire first gate electrode is formed on the gate insulation film having the nitrogen-containing silicon dioxide film.

49. The semiconductor memory device as claimed in claim 26, wherein a part of the first gate electrode is formed on the gate insulation film having the nitrogen-containing silicon dioxide film, and the other part of the first gate electrode is formed on a second gate insulation film not having the nitrogen-containing silicon dioxide film.

50. The semiconductor memory device as claimed in claim 26, wherein the first gate electrode and a second gate electrode are provided on the semiconductor substrate between the first and second impurity diffused layers, and the second gate electrode is formed on a second gate insulation film not having the nitrogen-containing silicon dioxide film.

51. The semiconductor memory device as claimed in claim 26, wherein at least a part of the gate insulation film that isolates the nitrogen-containing silicon dioxide film from the gate electrode is composed of an insulation film with a high dielectric constant.

52. The semiconductor memory device as claimed in claim 26, wherein at least a part of the gate insulation film that isolates the nitrogen-containing silicon dioxide film from the gate electrode is composed of a laminated structure constructed from a silicon dioxide film, a silicon nitride film and a silicon dioxide film.

53. The semiconductor memory device as claimed in claim 26, wherein a maximum value of the nitrogen composition in the nitrogen-containing silicon dioxide film is 7% or more but less than 35%.

54. The semiconductor memory device as claimed in claim 26, wherein a rate of change of the nitrogen composition in the nitrogen-containing silicon dioxide film is 5% or more but less than 30% per 1 nm of a film thickness of the nitrogen-containing silicon dioxide film.

55. The semiconductor memory device as claimed in claim 26, wherein a space between the nitrogen-containing silicon dioxide film and the semiconductor substrate is 4 nm or more.

56. The semiconductor memory device as claimed in claim 26, wherein a space between the nitrogen-containing silicon dioxide film and the semiconductor substrate is less than 4 nm.

57. The semiconductor memory device as claimed in claim 26, wherein a space between the nitrogen-containing silicon dioxide film and the first gate electrode is 4 nm or more.

58. The semiconductor memory device as claimed in claim 26, wherein a space between the nitrogen-containing silicon dioxide film and the first gate electrode is 4 nm or more.

59. The semiconductor memory device as claimed in claim 26, wherein the memory cell is formed on one region of the semiconductor substrate, and a logic circuit is formed on the other region of the semiconductor substrate.

60. A semiconductor memory device comprising a plurality of memory cells each carrying out a storing operation by capturing an electrical charge in a gate insulation film, the memory cell comprising:

a semiconductor substrate; first and second impurity diffused layers formed in the semiconductor substrate; a gate insulation film formed on the semiconductor substrate; and a first gate electrode formed on the semiconductor substrate through the gate insulation film, the gate insulation film having a silicon dioxide film containing aluminum or alumina therein, a periphery of the silicon dioxide film containing aluminum or alumina being enclosed by an insulation film having a band gap higher than that of the silicon dioxide film containing aluminum or alumina, composition of aluminum or alumina in the silicon dioxide film containing aluminum or alumina becoming higher at a side of the first gate electrode compared with a side of the semiconductor substrate.

* * * * *